United States Patent
Shim et al.

(10) Patent No.: US 9,812,214 B2
(45) Date of Patent: Nov. 7, 2017

(54) NONVOLATILE MEMORY DEVICE, STORAGE DEVICE INCLUDING NONVOLATILE MEMORY DEVICE AND OPERATING METHOD OF NONVOLATILE MEMORY DEVICE

(71) Applicant: Samsung Electronics Co., Ltd., Suwon-si (KR)

(72) Inventors: Dongkyo Shim, Seoul (KR); Sang-Soo Park, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/340,957

(22) Filed: Nov. 1, 2016

(65) Prior Publication Data

US 2017/0125116 A1  May 4, 2017

(30) Foreign Application Priority Data

Nov. 2, 2015  (KR) ........................ 10-2015-0153267

(51) Int. Cl.
| | | |
|---|---|---|
| *G11C 16/34* | (2006.01) | |
| *G11C 16/08* | (2006.01) | |
| *G11C 16/10* | (2006.01) | |
| *G11C 16/16* | (2006.01) | |
| *G11C 11/56* | (2006.01) | |
| *G11C 16/14* | (2006.01) | |

(Continued)

(52) U.S. Cl.
CPC ...... *G11C 16/3445* (2013.01); *G11C 11/5635* (2013.01); *G11C 16/08* (2013.01); *G11C 16/10* (2013.01); *G11C 16/14* (2013.01); *G11C 16/16* (2013.01); *G11C 16/0483* (2013.01); *G11C 16/26* (2013.01)

(58) Field of Classification Search
CPC ..... G11C 16/3445; G11C 16/16; G11C 16/10; G11C 16/0483; G11C 16/08; G11C 16/26
See application file for complete search history.

(56) References Cited

U.S. PATENT DOCUMENTS 6,219,280 B1 * 4/2001 Naganawa ........... G11C 16/107
365/185.11
6,891,752 B1   5/2005 Bautista et al.
(Continued)

FOREIGN PATENT DOCUMENTS

JP       2009-099199 A      5/2009

*Primary Examiner* — Khamdan Alrobaie
(74) *Attorney, Agent, or Firm* — Muir Patent Law, PLLC

(57) ABSTRACT

A nonvolatile memory device may include a memory cell array, an address decoder circuit, a page buffer circuit, and a control logic circuit. An erase operation includes iteratively performing an erase loop which includes an erase section where an erase voltage is applied to the memory cells of the selected memory block and an erase verification section where the memory cells of the selected memory block are verified using an erase verification voltage. If the memory cells of the selected memory block are determined as an erase pass in the erase verification section, the control logic circuit monitors the memory cells of the selected memory block. If the monitored result indicates that the memory cells of the selected memory block are at an abnormal state, the control logic circuit applies an extra erase voltage to the memory cells of the selected memory block.

20 Claims, 20 Drawing Sheets

(51) Int. Cl.
    *G11C 16/04*     (2006.01)
    *G11C 16/26*     (2006.01)

(56)           References Cited

U.S. PATENT DOCUMENTS

| | | |
|---|---|---|
| 7,679,133 B2 | 3/2010 | Son et al. |
| 8,300,444 B2 | 10/2012 | Nagashima et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2003/0076710 A1* | 4/2003 | Sofer ............... G11C 16/14 365/185.22 |
| 2006/0098492 A1 | 5/2006 | Lee |
| 2007/0103974 A1* | 5/2007 | Takeguchi ......... G11C 16/16 365/185.3 |
| 2008/0158994 A1* | 7/2008 | Yang ............. G11C 11/5635 365/185.22 |
| 2008/0225602 A1 | 9/2008 | Matsubara et al. |
| 2009/0003064 A1 | 1/2009 | Kim et al. |
| 2009/0244969 A1* | 10/2009 | Maejima ......... G11C 11/5642 365/185.03 |
| 2010/0027326 A1 | 2/2010 | Kim et al. |
| 2011/0233648 A1 | 9/2011 | Seol et al. |
| 2012/0243328 A1* | 9/2012 | Tatebe ............... G11C 16/16 365/185.22 |
| 2012/0275232 A1 | 11/2012 | Park |
| 2014/0003147 A1 | 1/2014 | Dutta et al. |
| 2014/0003156 A1* | 1/2014 | He ............... G11C 11/5635 365/185.22 |
| 2014/0198569 A1 | 7/2014 | Kim et al. |
| 2014/0226407 A1* | 8/2014 | Izumi ............. G11C 16/3445 365/185.17 |
| 2015/0170748 A1 | 6/2015 | Costa et al. |

* cited by examiner

NONVOLATILE MEMORY DEVICE, STORAGE DEVICE INCLUDING NONVOLATILE MEMORY DEVICE AND OPERATING METHOD OF NONVOLATILE MEMORY DEVICE

CROSS-REFERENCE TO RELATED APPLICATIONS

This U.S. non-provisional application claims priority under 35 U.S.C. §119 to Korean Patent Application No. 10-2015-0153267 filed on Nov. 2, 2015, in the Korean Intellectual Property Office, the disclosure of which is hereby incorporated by reference in its entirety.

BACKGROUND

Embodiments of the present disclosure relate to a semiconductor device, and in particular, to a nonvolatile memory device, a storage device including the nonvolatile memory device, and an operating method of the nonvolatile memory device.

A storage device refers to a device, which stores data under control of a host device, such as a computer, a smart phone, or a smart pad. The storage device includes a device, which stores data on a magnetic disk, such as a hard disk drive (HDD), or a device, which stores data on a semiconductor memory, for example, a nonvolatile memory, such as a solid state drive (SSD) or a memory card.

The nonvolatile memory may include, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

The degree of integration and volume of nonvolatile memory devices and storage devices continue to increase as semiconductor manufacturing technologies develop. As nonvolatile memory devices and storage devices are highly integrated, the manufacturing cost thereof lowers. However, the high degree of integration of nonvolatile memory devices and storage devices causes scale-down and a structure change thereof, and thus various issues newly occur. Such issues cause the corruption of data stored in storage devices, thereby lowering the reliability of the storage devices. A method and a device capable of improving the reliability of nonvolatile memory devices and storage devices would be desirable.

SUMMARY

Embodiments of the present disclosure provide a nonvolatile memory device, a storage device including the nonvolatile memory device, and an operating method of the nonvolatile memory device.

One aspect of embodiments of the disclosure is directed to provide a nonvolatile memory device. The nonvolatile memory device may include a plurality of memory blocks each comprising a plurality of memory cells, an address decoder circuit connected to the memory cells through word lines, a page buffer circuit connected to the memory cell array through bit lines, and control logic circuit configured to control an erase operation of memory cells in a memory block selected from the memory blocks. The erase operation may include iteratively performing an erase loop which includes an erase section in which an erase voltage is applied to the memory cells of the selected memory block and an erase verification section in which the memory cells of the selected memory block are verified using an erase verification voltage. If the memory cells of the selected memory block are determined as an erase pass in the erase verification section, the control logic circuit may be configured to monitor the memory cells of the selected memory block. If the monitored result indicates that the memory cells of the selected memory block are at an abnormal state, the control logic circuit may be configured to apply an extra erase voltage to the memory cells of the selected memory block.

Another aspect of embodiments of the disclosure is directed to provide a storage device. The storage device may include a nonvolatile memory device comprising a plurality of memory blocks each comprising a plurality of memory cells, and a controller configured to transfer an erase command on a selected memory block of the nonvolatile memory device to the nonvolatile memory device. The nonvolatile memory device may be configured to perform an erase operation on memory cells of the selected memory block in response to the erase command. The erase operation may include iteratively performing an erase loop which includes an erase section in which an erase voltage is applied to the memory cells of the selected memory block and an erase verification section in which the memory cells of the selected memory block are verified using an erase verification voltage. If the memory cells of the selected memory block are determined as an erase pass in the erase verification section, the nonvolatile memory device may be configured to monitor the memory cells of the selected memory block. If the monitored result indicates that the memory cells of the selected memory block are at an abnormal state, the nonvolatile memory device may be configured to apply an extra erase voltage to the memory cells of the selected memory block.

Still another aspect of embodiments of the disclosure is directed to provide a method for operating a nonvolatile memory device which includes a plurality of memory blocks each comprising a plurality of memory cells. The method may include performing an erase by applying an erase voltage to memory cells of a first memory block of the plurality of memory blocks, after the erase is performed, performing a first read on the memory cells of the first memory block using a first read voltage, counting a number of on-cells or off-cells based on a result of the first read, performing a second read on the memory cells of the first memory block using a second read voltage smaller than the first read voltage, and performing an extra erase by applying an extra erase voltage to the memory cells of the first memory block based on a result of the second read.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
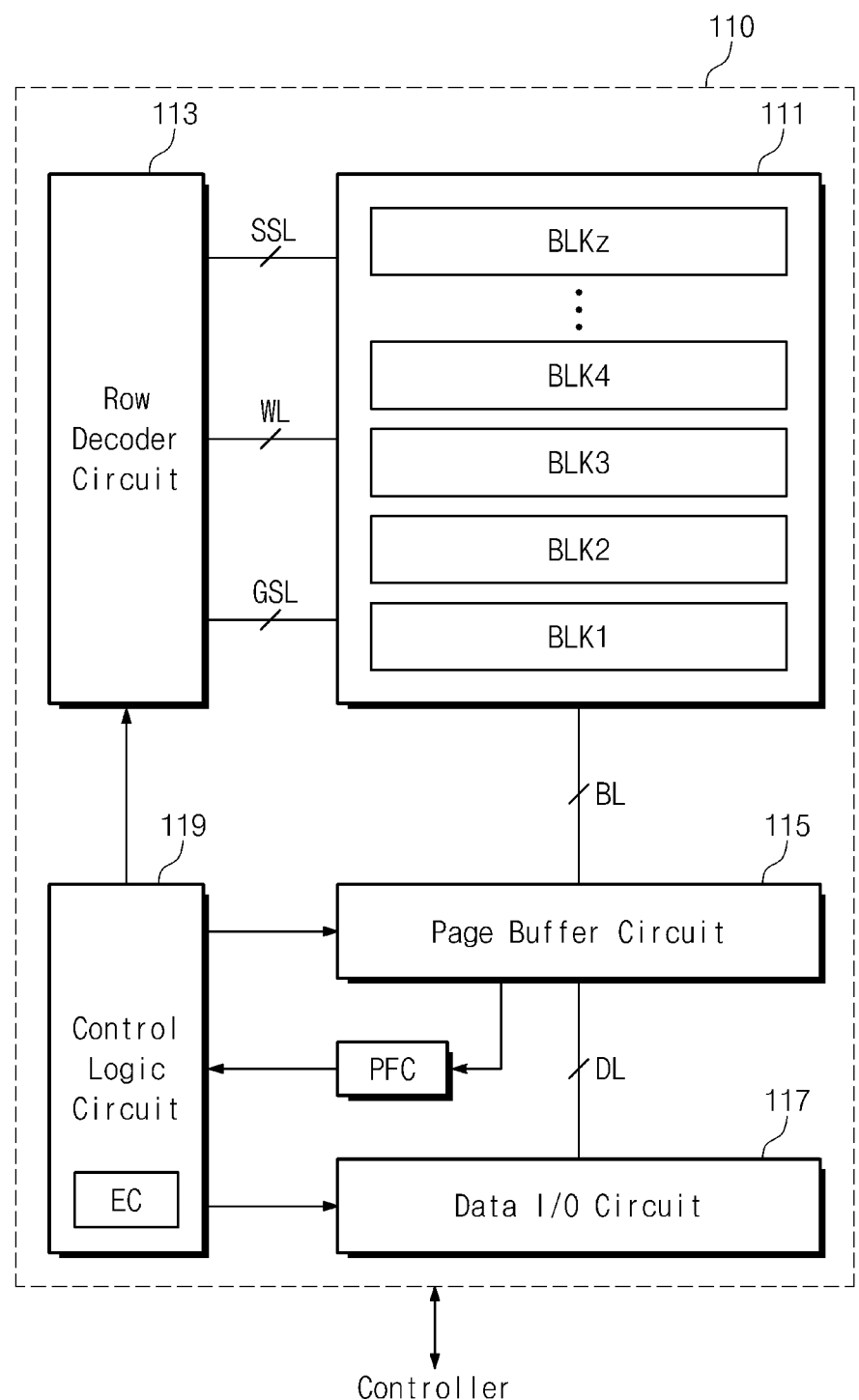
FIG. 1 is a block diagram illustrating a nonvolatile memory device according to example embodiments.

Below, embodiments of the present disclosure will be described in detail with reference to the attached drawings.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory 110 according to example embodiments. Referring to FIG. 1, a nonvolatile memory 110 may include a memory cell array 111, a row decoder circuit 113, a page buffer circuit 115, a data input/output circuit 117, and a control logic circuit 119.

The memory cell array 111 may include a plurality of memory blocks BLK1 to BLKz. Each memory block may include a plurality of memory cells. Each memory block may be connected to the row decoder circuit 113 through at least one string selection line SSL, a plurality of word lines WL, and at least one string selection line SSL. Each of the memory blocks BLK1 to BLKz may be connected to the page buffer circuit 115 through a plurality of bit lines BL. The memory blocks BLK1 to BLKz may be connected in common to the plurality of bit lines BL. Memory cells in the memory blocks BLK1 to BLKz may have the same structures.

In an embodiment, each of the memory blocks BLK1 to BLKz may be a unit of an erase operation. Memory cells in the memory cell array 111 may be erased by the memory block. The memory cells belonging to a memory block may be erased at the same time. In another embodiment, each memory block may be divided into a plurality of sub-blocks. Erasing may be made by a sub-block of the plurality of sub-blocks.

In an embodiment, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

The row decoder circuit 113 may be connected to the memory cell array 111 through a plurality of ground selection lines GSL, the plurality of word lines WL, and a plurality of string selection lines SSL. The row decoder circuit 113 may operate according to control of the control logic circuit 119. The row decoder circuit 113 may decode an address received from a controller through an input/output channel and may switch voltages to be applied to the string selection lines SSL, the word lines WL, and the ground selection lines GSL based on the decoded address.

For example, during a program operation, the row decoder circuit 113 may apply a program voltage to a selected word line in a memory block selected by an address and a pass voltage to unselected word lines in the selected memory block. During a read operation, the row decoder circuit 113 may apply a selection read voltage to the selected word line and a non-selection read voltage to unselected word lines in the selected memory block. During an erase operation, the row decoder circuit 113 may apply an erase voltage (e.g., a ground voltage, a positive or negative voltage of which the level is similar to that of the ground voltage) to word lines in the selected memory block.

The page buffer circuit 115 may be connected to the memory cell array 111 through the bit lines BL. The page buffer circuit 115 may be connected to the data input output circuit 117 through a plurality of data lines DL. The page buffer circuit 115 may operate under control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation, the page buffer circuit 115 may sense voltages on the bit lines BL and may store the sensed result. For example, the page buffer circuit 115 may function as a sense amplifier.

The data input/output circuit 117 may be connected to the page buffer circuit 115 through the data lines DL. The data input/output circuit 117 may output data, which is read by the page buffer circuit 115, to the controller through an input/output channel and may transfer data, which is received from the controller through the input/output channel, to the page buffer circuit 115.

A pass/fail check circuit PFC may receive the result of a verification operation from the page buffer circuit 115. The pass/fail check circuit PFC may determine pass or fail, based on the result of the verification read operation. For example, during a program verification read operation, the pass/fail check circuit PFC may count the number of on-cells (i.e., the number of turned-on cells). When the number of on-cells is smaller than or equal to a threshold value (or reference value), the pass/fail check circuit PFC may determine program pass. Hereinafter, the threshold value at respective events may be the same or different from each other. When the number of on-cells is greater than the first threshold value, the PFC may determine program fail. For example, when an erase verification read operation is performed, the pass/fail check circuit PFC may count the number of off-cells (i.e., the number of turned-off cells). When the number of off-cells is smaller than or equal to a second threshold value, the pass/fail check circuit PFC may determine an erase pass. When the number of off-cells is greater than the second threshold value, the pass/fail check circuit PFC may determine an erase fail. The pass/fail check circuit PFC may output pass or fail information to the control logic circuit 119. In an embodiment, an off-cell may correspond to logic 0 and an on-cell may correspond to logic 1. In another embodiment, an off-cell may correspond to logic 1 and an on-cell may correspond to logic 0.

The control logic circuit 119 may receive a command from the controller through the input/output channel and may receive a control signal therefrom through a control channel. The control logic circuit 119 may receive a command through the input/output channel in response to the control signal, may transmit an address, which is received through the input/output channel, to the row decoder circuit 113, and may transmit data, which is received through the input/output channel, to the data input/output circuit 117. The control logic circuit 119 may decode the received command and may control the nonvolatile memory device 110 based on the decoded command.

The control logic circuit 119 may control a program operation or an erase operation based on the pass or fail information from the pass/fail check circuit PFC.

In an embodiment, during a read operation, the control logic circuit 119 may generate a data strobe signal DQS based on a read enable signal /RE received from the controller through the control channel. The data strobe signal DQS thus generated may be outputted to the controller through the control channel. During a program operation, the control logic circuit 119 may receive the data strobe signal DQS from the controller through the control channel.

The control logic circuit 119 may include an erase controller EC. The erase controller EC may be configured to control an erase operation of memory cells of a memory block (or a sub-block) selected by an address received from the controller. Furthermore, the erase controller EC may be configured to control a monitor read operation following the erase operation and an operation of applying an extra erase voltage based on a result of the monitor read operation. Below, for descriptive convenience, it may be assumed that the erase controller EC controls the erase operation by a memory block. However, the scope and spirit of the disclosure may not be limited thereto. For example, the erase controller EC may control the erase operation by a sub-block. Operations controlled by the erase controller EC will be described with reference to accompanying drawings.

Figure 2:
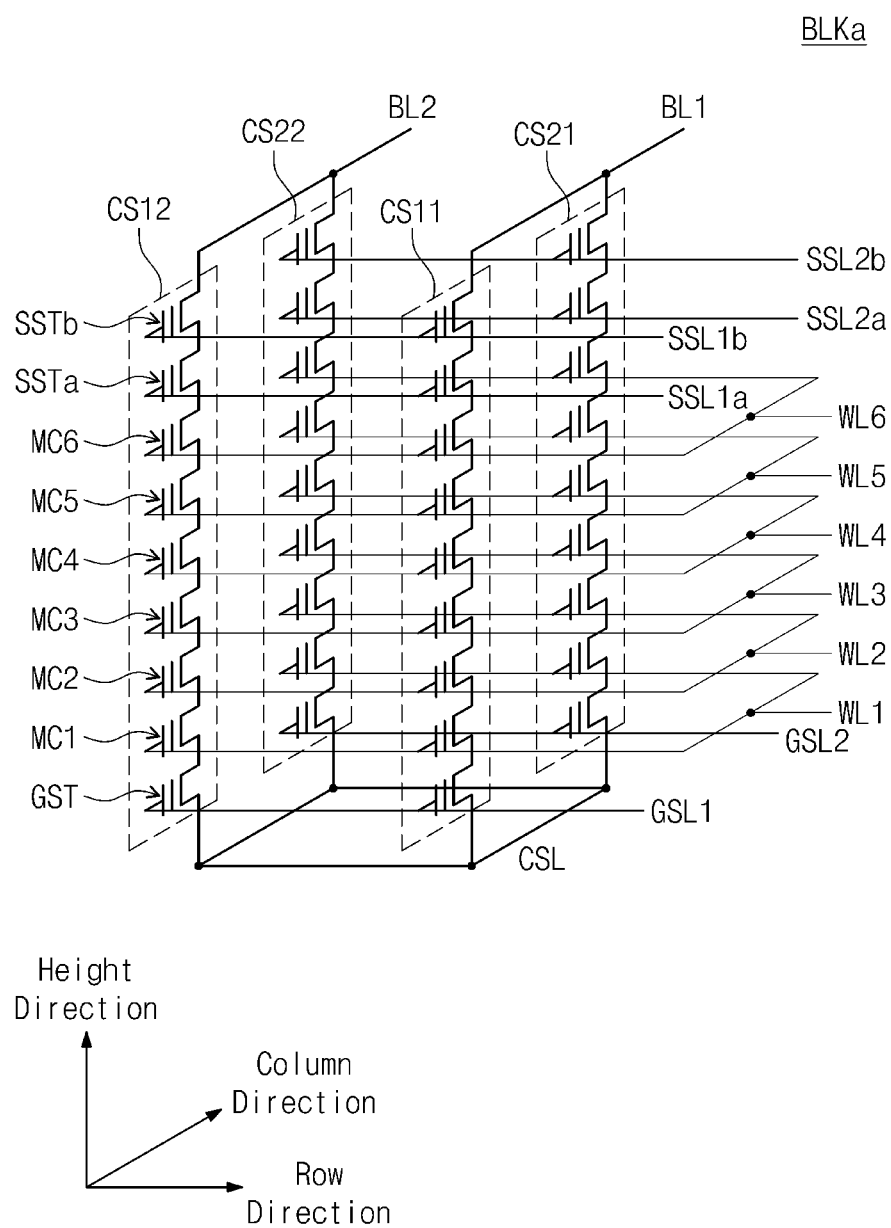
FIG. 2 is a circuit diagram illustrating a memory block according to example embodiments.

FIG. 2 is a circuit diagram illustrating a memory block BLKa according to example embodiments. Referring to FIG. 2, a memory block BLKa may include a plurality of cell strings CS11 to CS21 and CS12 to CS22. The plurality of cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. The cell transistors may include ground selection transistors GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Each cell transistor may be a charge trap type cell transistor of which the threshold voltage changes according to the amount of charges trapped in an insulating layer thereof.

Lowermost ground selection transistors GST may be connected in common to a common source line CSL.

Control gates of ground selection transistors GST of the cell strings CS11 and CS12 in a first row may be connected in common to a ground selection line GSL1, and control gates of ground selection transistors GST of the cell strings CS21 and CS22 in a second row may be connected in common to a ground selection line GSL2. That is, cell strings in different rows may be connected to different ground selection lines.

In an embodiment, the memory block BLKa may be modified or changed such that ground selection lines which are connected to ground selection transistors belonging to the same row and placed at different heights are connected to different ground selection lines. In an embodiment, the memory block BLKa may be modified or changed such that ground selection lines which are connected to ground selection transistors belonging to different rows and placed at the same height are interconnected and controlled in common. In an embodiment, the memory block BLKa may be modified or changed such that ground selection lines which are connected to ground selection transistors are interconnected and controlled in common.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

In the first string selection transistors SSTa of the cell strings CS11 to CS21 and CS12 to CS22 which have the same height (or order), control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

In the second string selection transistors SSTb of the cell strings CS11 to CS21 and CS12 to CS22 which have the same height (or order), control gates of the second string selection transistors SSTb in different rows may be connected to different string selection lines SSL1b and SSL2b. For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

That is, cell strings in different rows may be connected to different string selection lines. String selection transistors of cell strings which have the same height (or order) and belong to the same row may be connected to the same string selection line. String selection transistors of cell strings which have different heights (or orders) and belong to the same row may be connected to different string selection lines.

In an embodiment, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11 through CS21 and CS12 through CS22 may be connected to different bit lines BL1 and BL2, respectively. For example, the string selection transistors SSTb of the cell strings CS11 and CS21 in the first column may be connected in common to the bit line BL1. The string selection transistors SSTb of the cell strings CS12 and CS22 in the second column may be connected in common to the bit line BL2.

The memory block BLKa may be characterized in that memory cells placed at the same height from the substrate share a word line. The memory block BLKa may be also characterized in that different memory blocks do not share word lines. For example, a memory cell of a first memory block placed at a first height may share a word line with another memory cell of the first memory block placed at the first height. The memory cell of the first memory block placed at the first height may not share a word line with a memory cell of a second memory block placed at the first height. A sub-block may be a portion of the memory block BLKa.

The cell strings CS11 and CS12 may constitute a first plane. The cell strings CS21 and CS22 may constitute a second plane.

In the memory block BLKa, memory cells of each plane placed at the same height may constitute a physical page. The physical page may refer to a unit by which the memory cells MC1 to MC6 are written and read. For example, one plane of the memory block BLKa may be selected by the string selection lines SSL1a, SSL1b, SSL2a, and SSL2b. The cell strings CS11 and CS12 in the first plane may be connected to the bit lines BL1 and BL2 when a turn-on voltage is respectively supplied to the string selection lines SSL1a and SSL1b and a turn-off voltage is respectively supplied to the string selection lines SSL2a and SSL2b. That is, the first plane may be selected. The cell strings CS21 and CS22 in a second plane may be connected to the bit lines BL1 and BL2 when the turn-on voltage is respectively supplied to the string selection lines SSL2a and SSL2b and the turn-off voltage is respectively supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be respectively applied to remaining word lines WL1 and WL3 to WL6. That is, a physical page which corresponds to the second word line WL2 of the second plane may be selected by adjusting voltages of the string selection lines SSL1a, SSL1b, SSL2a, and SSL2b and the word lines WL1 to WL6. A write or read operation may be performed with respect to memory cells MC2 in the selected physical page.

For example, two or more bits may be written at each memory cell MC. Bits which are written at memory cells belonging to one physical page may be used to define logical pages. First bits which are written at memory cells belonging to one physical page may constitute a first logical page. N-th bits which are written at memory cells belonging to one physical page may constitute an N-th logical page. A logical page may refer to a unit by which data is accessed. When a read operation is performed with respect to a physical page, data may be accessed by the logical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external controller). When erasing is performed by the sub-block, a portion of memory cells MC in the memory block BLKa may be simultaneously erased according to an erase request (e.g., an erase request from an external controller), and the others may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

The memory block BLKa shown in FIG. 2 is an example. However, the scope and spirit of the disclosure may not be limited thereto. For example, the number of rows of cell strings may increase or decrease. As the number of rows of cell strings is changed, the number of string or ground selection lines and the number of cell strings connected to a bit line may be also changed.

The number of columns of cell strings may increase or decrease. As the number of columns of cell strings is changed, the number of bit lines connected to columns of cell strings and the number of cell strings connected to a string selection line may be also changed.

A height of the cell strings may increase or decrease. For example, the number of ground selection transistors, memory cells, or string selection transistors that are stacked in each cell string may increase or decrease.

In an embodiment, memory cells MC in a physical page may correspond to at least three logical pages. For example, k bits (k being an integer of 2 or more) may be programmed in a memory cell MC. Memory cells MC of a physical page may store in k logical pages each of which is composed of n bits respectively programmed in memory cells MC.

As described above, the memory block BLKa may be provided with a three-dimensional memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present inventive concept, the 3D memory array includes vertical NAND strings (or cell strings) that are vertically oriented such that at least one memory cell is located over another memory cell. The at least one memory cell MC may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
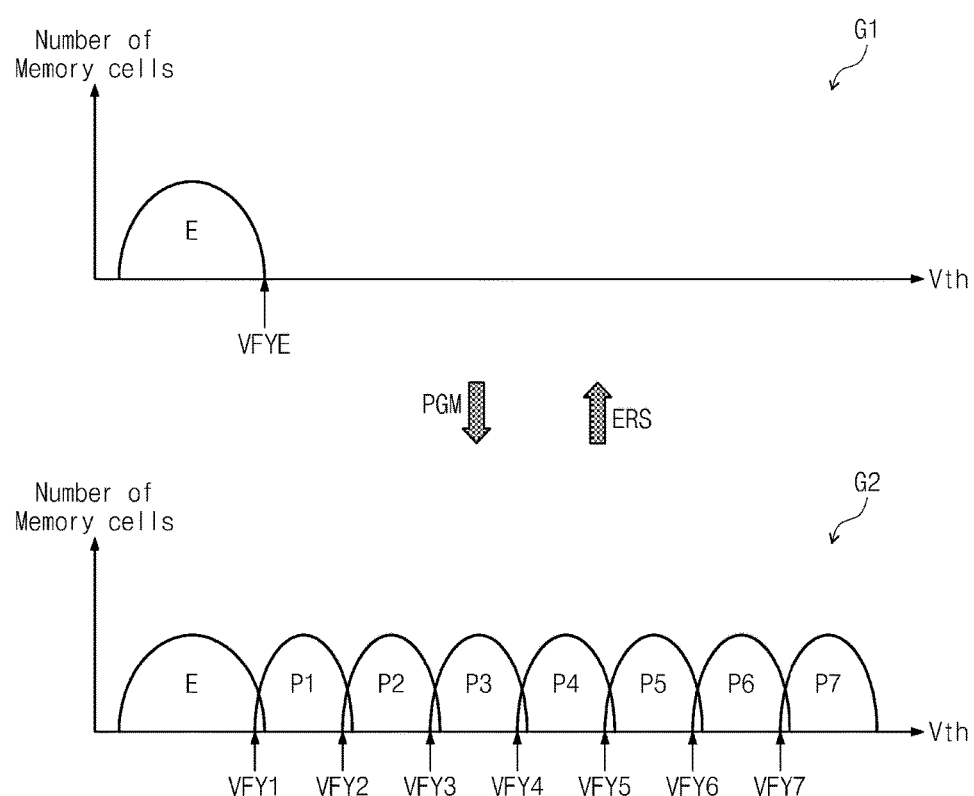
FIG. 3 is graphs illustrating an example in which threshold voltages of memory cells are changed in programming and erasing the memory cells of a memory block.

FIG. 3 is graphs illustrating an example in which threshold voltages of memory cells MC are changed in programming and erasing the memory cells of a memory block BLKa. In FIG. 3, the abscissa represents threshold voltages of memory cells MC, and the ordinate represents the number of memory cells MC. That is, graphs G1 and G2 of FIG. 3 show threshold voltage distributions of memory cells.

Referring to FIGS. 1 to 3, the first graph G1 may illustrate threshold voltages of memory cells when an erase operation ERS is performed. The second graph G2 may illustrate threshold voltages of memory cells when a program operation PGM is performed.

First of all, referring to the first graph G1, memory cells MC may have an erase state E. Memory cells each having the erase state E may be programmed by a program operation PGM. When programmed, the memory cells MC may have threshold voltages illustrated in the second graph G2.

The program operation PGM may include a plurality of program loops. Each program loop may include a program section and a program verification section. In the program section, there may be performed the following: selecting a plane to be programmed by adjusting voltages of string selection lines SSL1a, SSL1b, SSL2a, and SSL2b, selecting columns of memory cells to be programmed by adjusting voltages of the bit lines BL1 and BL2, and selecting a height of the memory cells to be programmed by applying a program voltage to a selected word line and a pass voltage to unselected word lines.

In the program verification section, there may be performed the following: a program verification read and a pass/fail check. The program verification read may include reading programmed memory cells under the condition that the programmed memory cells are electrically connected with the bit lines BL1 and BL2 and the common source line CSL and a program verification voltage is respectively applied to control gates of the programmed memory cells. The pass/fail check may include determining whether the number of memory cells, each of which has a threshold voltage lower than the program verification voltage, from among memory cells to be programmed to have a threshold voltage higher than the program verification voltage is smaller than or equal to a threshold value, based on a result of the program verification read. A program pass may be determined when the number of memory cells each having a threshold voltage lower than the program verification voltage is smaller than or equal to the threshold value. A program fail may be determined when the number of memory cells each having a threshold voltage lower than the program verification voltage is greater than the threshold value. The threshold value may be 0 or a positive integer.

The number of times that program verification section is performed may be determined according to target states to which the memory cells are to be programmed. For example, when 3-bit data is programmed per a memory cell, the programmed memory cell may have one of eight states: an erase state E and first to seventh states P1 to P7 as shown in FIG. 3. During the program verification section, the memory cells MC may be verified using first to seventh program verification voltages VFY1 to VFY7 corresponding to the first to seventh states P1 to P7. For example, when N bit data is programmed per a memory cell, the memory cells may be verified using first to ($2^N$-1)-th program verification voltages corresponding to the first to ($2^N$-1)-th states.

Memory cells of which the target state corresponds to the erase state E may be program-inhibited.

Memory cells MC the target state of each of which corresponds to the first program state P1 may be programmed to have threshold voltages higher than the first program verification voltage VFY1. For example, when the number of memory cells, each of which has a threshold voltage lower than or equal to the first verification voltage VFY1, from among the memory cells to be programmed to the first program state P1 is smaller than or equal to a first threshold value, the memory cells programmed to the first program state P1 may be determined as being program passed.

Memory cells MC the target state of each of which corresponds to the second program state P2 may be programmed to have threshold voltages higher than the second program verification voltage VFY2. For example, when the number of memory cells, each of which has a threshold voltage lower than or equal to the second verification voltage VFY2, from among the memory cells to be programmed to the second program state P2 is smaller than or equal to a second threshold value, the memory cells programmed to the second program state P2 may be determined as being program passed.

Memory cells MC the target state of each of which corresponds to the third program state P3 may be programmed to have threshold voltages higher than the third program verification voltage VFY3. For example, when the number of memory cells, each of which has a threshold voltage lower than or equal to the third verification voltage VFY3, from among the memory cells to be programmed to the third program state P3 is smaller than or equal to a third threshold value, the memory cells programmed to the third program state P3 may be determined as being program passed.

Memory cells MC the target state of each of which corresponds to the fourth program state P4 may be programmed to have threshold voltages higher than the fourth program verification voltage VFY4. For example, when the number of memory cells, each of which has a threshold voltage lower than or equal to the fourth verification voltage VFY4, from among the memory cells to be programmed to the fourth program state P4 is smaller than or equal to a fourth threshold value, the memory cells programmed to the fourth program state P4 may be determined as being program passed.

Memory cells MC the target state of each of which corresponds to the fifth program state P5 may be programmed to have threshold voltages higher than the fifth program verification voltage VFY5. For example, when the number of memory cells, each of which has a threshold voltage lower than or equal to the fifth verification voltage VFY5, from among the memory cells to be programmed to the fifth program state P5 is smaller than or equal to a fifth threshold value, the memory cells programmed to the fifth program state P5 may be determined as being program passed.

Memory cells MC the target state of each of which corresponds to the sixth program state P6 may be programmed to have threshold voltages higher than the sixth program verification voltage VFY6. For example, when the number of memory cells, each of which has a threshold voltage lower than or equal to the sixth verification voltage VFY6, from among the memory cells to be programmed to the sixth program state P6 is smaller than or equal to a sixth threshold value, the memory cells programmed to the sixth program state P6 may be determined as being program passed.

Memory cells MC the target state of each of which corresponds to the seventh program state P7 may be programmed to have threshold voltages higher than the seventh program verification voltage VFY7. For example, when the number of memory cells, each of which has a threshold voltage lower than or equal to the seventh verification voltage VFY7, from among the memory cells to be programmed to the seventh program state P7 is smaller than or equal to a seventh threshold value, the memory cells programmed to the seventh program state P7 may be determined as being program passed.

Each of the first to seventh threshold values may be 0 or a positive integer.

The program operation may end when memory cells targeted to the first to seventh program states P1 to P7 are program passed. A next program loop may progress when memory cells targeted to at least one of the first to seventh program states P1 to P7 is program failed. In the next program loop, a level of the program voltage may increase.

When erased, the memory cells MC may have threshold voltages illustrated in the first graph G1. The erase operation ERS may include a plurality of erase loops. Each erase loop may include an erase section and an erase verification section. In the erase section, there may be performed the following: applying a ground voltage, or a positive or negative low voltage, of which the level is similar to that of the ground voltage, to control gates of the memory cells MC and applying an erase voltage to channels of the memory cells MC.

In the erase verification section, there may be performed the following: an erase verification read and a pass/fail check. The erase verification read may include reading erased memory cells under the condition that the erased memory cells are electrically connected with the bit lines BL1 and BL2 and the common source line CSL and an erase verification voltage VFYE is respectively applied to control gates of the erased memory cells. The pass/fail check may include determining whether the number of memory cells each having a threshold voltage higher than the erase verification voltage VFYE is smaller than or equal to a threshold value, based on a result of the erase verification read operation. An erase pass may be determined when the number of memory cells each having a threshold voltage higher than the erase verification voltage VFYE is smaller than or equal to the threshold value. An erase fail may be determined when the number of memory cells each having a threshold voltage higher than the erase verification voltage VFYE is greater than the threshold value. The threshold value may be 0 or a positive integer.

In the second graph G2 of FIG. 3, an embodiment of the disclosure is exemplified as a threshold voltage distribution range of each of the erase state E and the first to seventh program states P1 to P7 is overlapped with threshold voltage distribution ranges of adjacent states. The threshold voltage distribution ranges may be overlapped due to a characteristic variation of memory cells and maybe controlled (or compensated/corrected) by an error detection and correction scheme within a correctable range.

As described with reference to FIGS. 1 and 2, the erase operation may be performed by a unit of the memory block. It is observed that a characteristic variation between memory blocks with a three-dimensional structure illustrated in FIG. 2 exists. The characteristic variation between memory blocks may cause a difference between threshold voltage distributions of memory blocks where an erase operation is performed.

Figure 4:
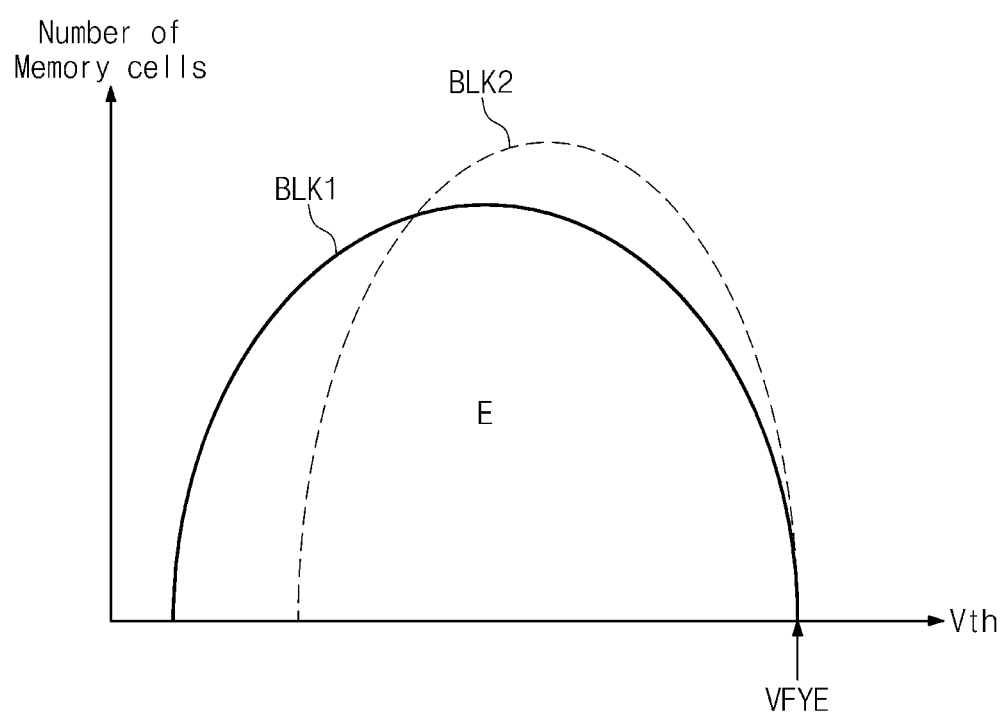
FIG. 4 is a graph illustrating an example of a difference between threshold voltage distributions of memory blocks where an erase operation is performed.

FIG. 4 is a graph illustrating an example of a difference between threshold voltage distributions of memory blocks where an erase operation is performed. In FIG. 4, the abscissa represents threshold voltages of memory cells MC, and the ordinate represents the number of memory cells MC.

Referring to. FIGS. 1, 2, and 4, a solid line may denote threshold voltages of memory cells in a first memory block BLK1, and a dotted line may denote threshold voltages of memory cells in a second memory block BLK2.

During an erase operation, the memory cells of the first memory block BLK1 and the memory cells of the second memory block BLK2 may be verified using the erase verification voltage VFYE. However, even though memory cells of the first and second memory blocks BLK1 and BLK2 are erased using the same erase verification voltage VFYE, a distribution level of threshold voltages of the memory cells in the first memory block BLK1 may be different from that of threshold voltages of the memory cells in the second memory block BLK2.

For example, a width of a threshold voltage distribution of the memory cells in the first memory block BLK1 may be wider than that of a threshold voltage distribution of the memory cells in the second memory block BLK2. In an embodiment, the memory cells in the first memory block BLK1 may be fast cells which are erased faster than the memory cells in the second memory block BLK2.

Figure 5:
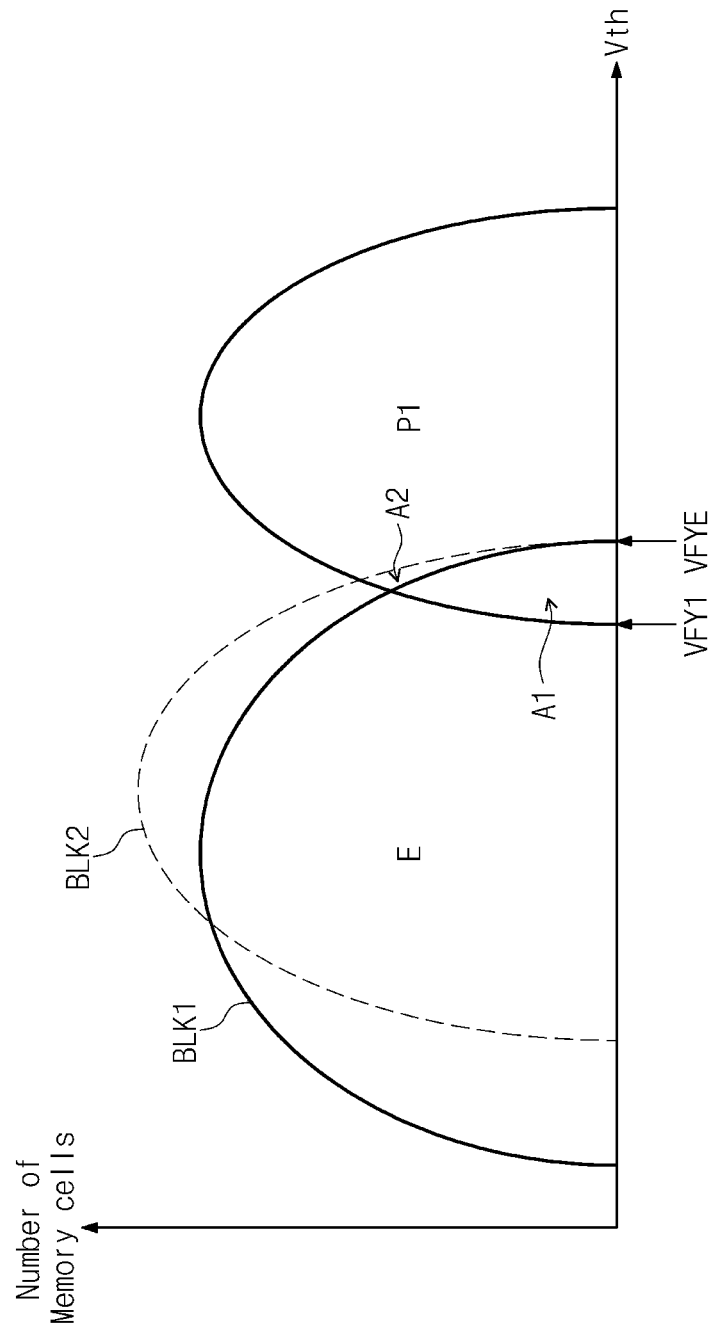
FIG. 5 is a diagram illustrating threshold voltages when a program operation is carried with respect to memory cells of a first memory block and memory cells of a second memory block in FIG. 4.

FIG. 5 is a diagram illustrating threshold voltages when a program operation is carried with respect to memory cells of a first memory block BLK1 and memory cells of a second memory block BLK2 in FIG. 4. In FIG. 5, the abscissa represents threshold voltages of memory cells MC, and the ordinate represents the number of memory cells MC.

In FIG. 5, there is illustrated a threshold voltage distribution of memory cells, which are programmed to a first program state P1, from among memory cells of a first memory block BLK1 or a second memory block BLK2.

In the case where a threshold voltage distribution of memory cells of an erase state E has a shape of a threshold voltage distribution of memory cells in the first memory block BLK1, memory cells of the erase state E and memory cells of a first program state P1 may be together distributed in an overlap area, for example, a first area A1. For example, after a program operation is performed, memory cells of the erase state E and the first program state P1 may have an error corresponding to the first area A1.

In the case where a threshold voltage distribution of memory cells of the erase state E has a shape of a threshold voltage distribution of memory cells in the second memory block BLK2, memory cells of the erase state E and memory cells of a first program state P1 may be together distributed in the first area A1 and a second area A2. For example, after a program operation is performed, memory cells of the erase state E and the first program state P1 may have an error corresponding to the first area A1 and the second area A2.

As described above, in the case where a threshold voltage distribution of memory cells of the erase state E and a threshold voltage distribution of memory cells in the second memory block BLK2 are formed, the number of errors may markedly increase after a program operation is performed.

To prevent the above-described issue, the error controller EC according to an embodiment of the disclosure may perform a monitor read operation after an erase operation is performed. The monitor read operation may be performed to monitor whether erased memory cells have a shape of a threshold voltage distribution such as that of memory cells in the second memory block BLK2. The erase controller EC may determine whether to apply an extra erase voltage, based on a result of the monitor read operation.

Figure 6:
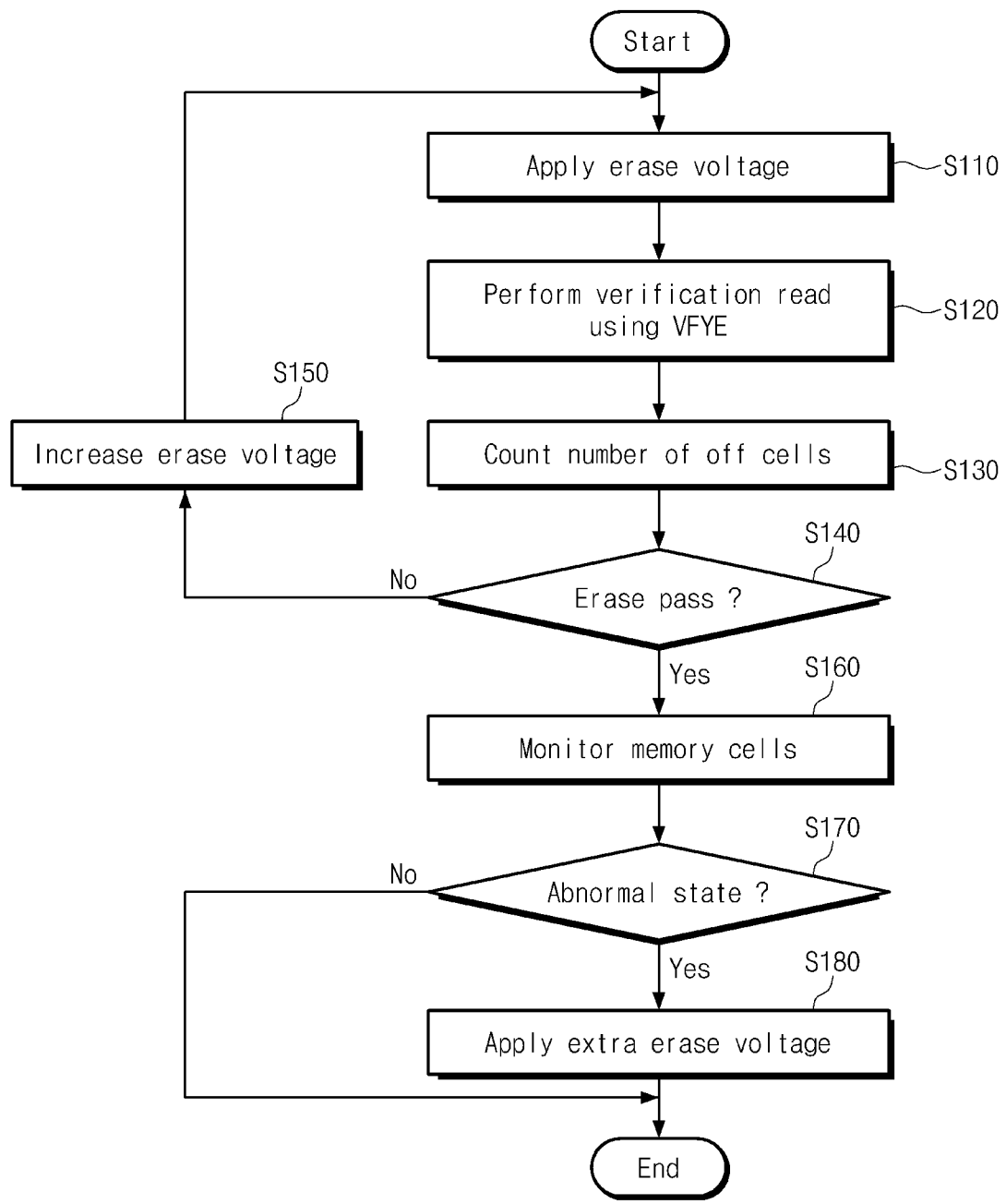
FIG. 6 is a flow chart illustrating an operating method of a nonvolatile memory device according to example embodiments.

FIG. 6 is a flow chart illustrating an operating method of a nonvolatile memory device 110 according to example embodiments. Referring to FIGS. 1, 2, and 6, in step S110, the nonvolatile memory device 110 may apply an erase voltage to memory cells of a selected memory block (e.g., BLKa). For example, an erase voltage may be applied to bodies of memory cells in the selected memory block under control of the control logic circuit 119. Step S110 may correspond to an erase section of an erase loop.

In step S120, a verification read may be performed with respect to the erased memory cells using the erase verification voltage VFYE. A result of the verification read may be transferred to the pass/fail check circuit PFC.

In step S130, the pass/fail check circuit PFC may count, for example, a number of off-cells. In step S140, the pass/fail check circuit PFC may determine whether the counting result indicates as an erase pass. For example, if the number of off-cells is smaller than or equal to a threshold value, the pass/fail check circuit PFC may determine an erase pass. If the number of off-cells is greater than the threshold value, the pass/fail check circuit PFC may determine an erase fail.

If the erase fail is determined, in step S150, the control logic circuit 119 may increase the erase voltage. Afterwards, the procedure may proceed to step S110. If the erase pass is determined, the procedure may proceed to step S160.

Steps S110 through S140 may compose an erase loop EL. Step S110 may correspond to an erase section of the erase loop EL, and steps S120 to S140 may correspond to an erase verification section thereof. Step S120 may correspond to a verification read of the erase verification section, and steps S130 to S140 may correspond to a pass/fail check of the erase verification section.

After the erase pass is determined, in step S160, the control logic circuit 119 may monitor memory cells (hereinafter referred to as "erased memory cells") which performed the erase operation. For example, the control logic circuit 119 may monitor whether a threshold voltage distribution of the erased memory cells is similar in shape to a threshold voltage distribution of memory cells of the second memory block BLK2 illustrated in FIGS. 4 and 5. In the case where the threshold voltage distribution of the erased memory cells is similar in shape to the threshold voltage distribution of the memory cells of the second memory block BLK2 illustrated in FIGS. 4 and 5, the control logic circuit 119 may determine the erased memory cells as being at an abnormal state. In the case where the threshold voltage distribution of the erased memory cells is similar in shape to a threshold voltage distribution of memory cells of the first memory block BLK1 illustrated in FIGS. 4 and 5, the control logic circuit 119 may determine the erased memory cells as being at a normal state.

If the erased memory cells are determined in step S170 as being at a normal state, an extra operation may not be performed. If the erased memory cells are determined as being at an abnormal state, the control logic circuit 119 may apply an extra erase voltage to the erased memory cells. For example, under control of the control logic circuit 119, a ground voltage, or a positive or negative low voltage of which the level is similar to that of the ground voltage may be applied to control gates of the erased memory cells, and the extra erase voltage may be applied to channels of the erased memory cells. For example, a level of the extra erase voltage may be the same as, lower, or higher than that of an erase voltage of the last (or most recent) erase loop. In an embodiment, after the extra erase voltage is applied, the control logic circuit 119 may end all operations (or processes) associated with the erase operation without performing the following operation (or process) such as a verification read or a pass/fail check.

Figure 7:
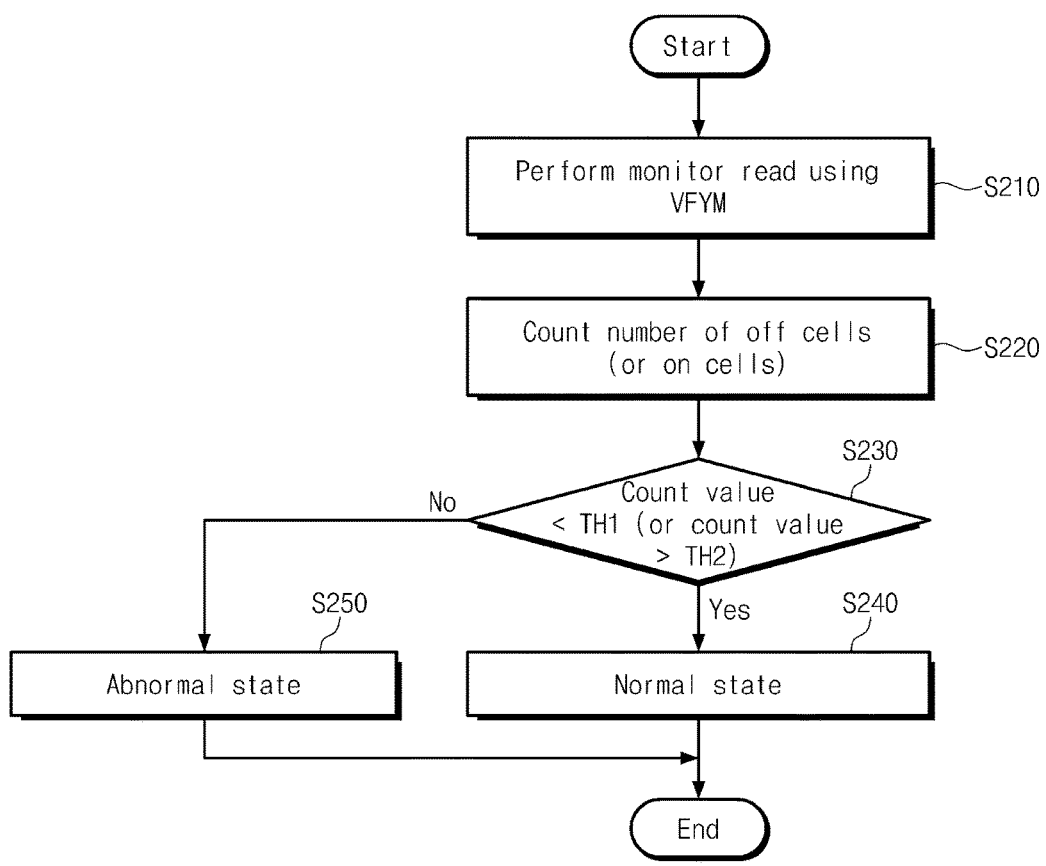
FIG. 7 is a flow chart illustrating a method for monitoring erased memory cells, according to example embodiments.

FIG. 7 is a flow chart illustrating a method for monitoring erased memory cells, according to example embodiments. Referring to. FIGS. 1, 2, and 7, in step S210, the control logic circuit 119 may control the row decoder circuit 113 and the page buffer circuit 115 so as to perform a monitor read operation using a monitor voltage VFYM. For example, the row decoder circuit 113 may apply the monitor voltage VFYM to at least one selected word line of the word lines WL1 to WL6. The page buffer circuit 115 may apply a power supply voltage to the bit lines BL1 and BL2, respectively. Memory cells, each of which has a threshold voltage lower than the monitor voltage VFYM, from among memory cells MC may be turned on. Memory cells, each of which has a threshold voltage higher than or equal to the monitor voltage VFYM, from among memory cells MC may be turned off.

When at least one of memory cells connected to one bit line is turned off, the page buffer circuit 115 may store off-cell information associated with the bit line. When all memory cells connected to one bit line is turned on, the page buffer circuit 115 may store on-cell information associated with the bit line. The page buffer circuit 115 may provide the pass/fail check circuit PFC with a monitor read result including the off-cell information and the on-cell information.

In step S220, the pass/fail check circuit PFC may count the number of off-cells (or on-cells).

In an embodiment, step S210 and step S220 may be repeated by a specific frequency. For example, a first group of memory cells among memory cells in a memory block BLKa may be selected, and step S210 and step S220 may be performed with respect to the memory cells in the first group thus selected. A second group of memory cells among the memory cells in the memory block BLKa may be selected, and step S210 and step S220 may be performed with respect to the memory cells in the second group thus selected. The pass/fail check circuit PFC may cumulate the number of off-cells (or on-cells) while step S210 and S220 are repeated by a specific frequency.

In an embodiment, each group may include memory cells in a plane (or a portion of a plane), memory cells in a column, memory cells with a height, or memory cells in a physical page.

In step S230, the pass/fail check circuit PFC may determine whether a count value is smaller than a first threshold value TH1 (or greater than a second threshold value TH2). For example, when counting off-cells, the pass/fail check circuit PFC may determine whether the count value is smaller than the first threshold value TH1. When counting on-cells, the pass/fail check circuit PFC may determine whether the count value is greater than the second threshold value TH2. For example, the second threshold value TH2 may be the same as or different from the first threshold value TH1.

If the count value is smaller than the first threshold value TH1 (or greater than the second threshold value TH2), in step S240, the erased memory cells may be determined as being at a normal state. If the count value is not smaller than the first threshold value TH1 (or not greater than the second threshold value TH2), in step S250, the erased memory cells may be determined as being at an abnormal state.

Figure 8:
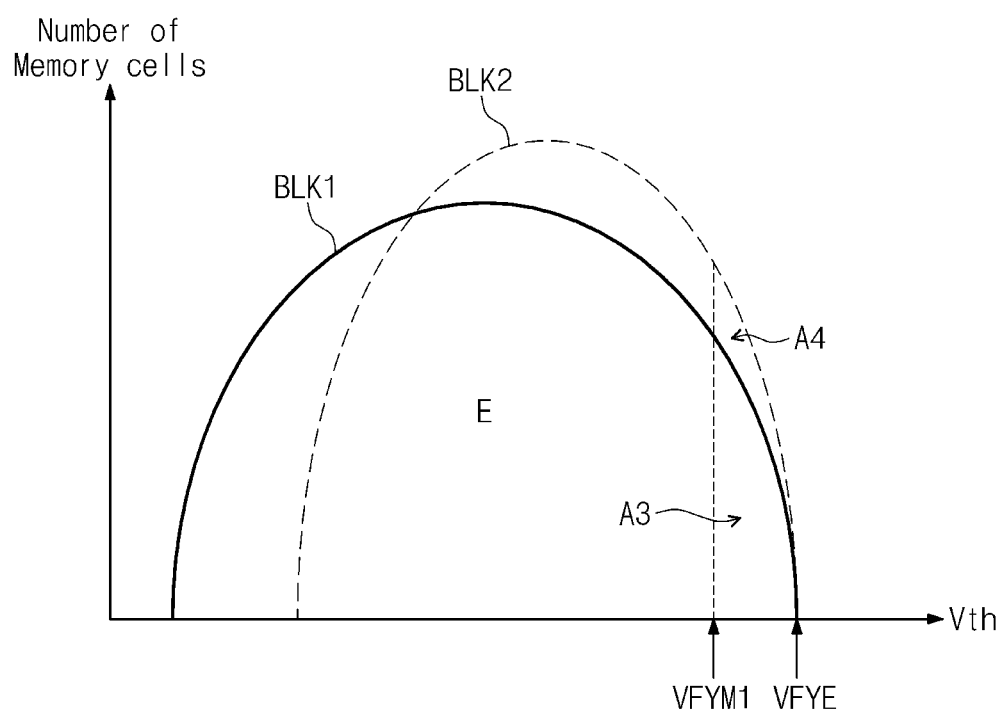
FIG. 8 is a diagram illustrating an example in which off-cells are counted based on a monitor read result according to example embodiments.

FIG. 8 is a diagram illustrating an example in which off-cells are counted based on a monitor read result according to example embodiments. FIG. 8 may be the same as FIG. 4 except the monitor voltage VFYM, a third area A3, and a fourth area A4 are further illustrated, and a duplicated description is thus omitted.

Referring to FIGS. 2, 7, and 8, a monitor voltage VFYM (e.g., VFYM1) may be lower than the erase verification voltage VFYE. For example, the monitor voltage VFYM1 may be a mid-point value of a threshold voltage distribution corresponding to the first memory block BLK1. When a read operation is performed using the monitor voltage VFYM1, memory cells, which belong to the third area A3, from among memory cells in a threshold voltage distribution corresponding to the first memory block BLK1 may be determined as off-cells. Memory cells, which belong to the third area A3 and the fourth area A4, from among memory cells in a threshold voltage distribution corresponding to the second memory block BLK2 may be determined as off-cells. Accordingly, when a first threshold value TH1 is determined as a value between the number of memory cells corresponding to the third area A3 and the number of memory cells corresponding to the third and fourth areas A3 and A4, whether a threshold voltage distribution of memory cells of an erase state E is normal or abnormal may be determined by the monitor read operation. For example, it may be determined that a memory block (e.g., first memory block BLK1) having a first number of memory cells in the third area A3 is in a normal state and a memory block (e.g., second memory block BLK2) having a second number of memory cells greater than the first number of memory cells in the third area A3 and the fourth area A4 is in an abnormal state.

Figure 9:
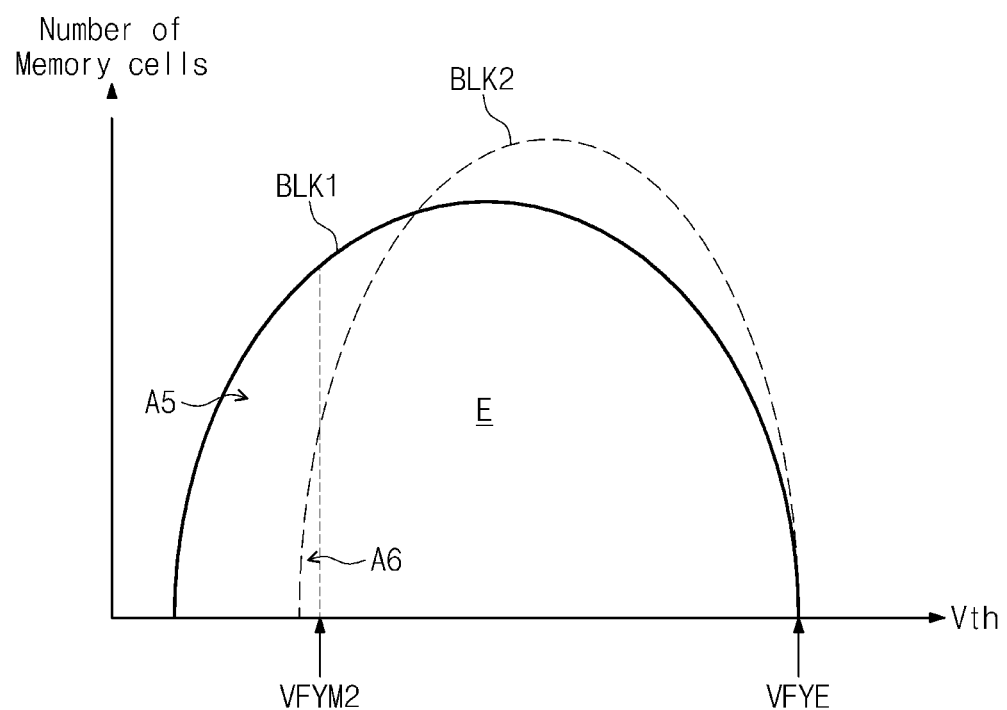
FIG. 9 is a diagram illustrating an example in which on-cells are counted based on a monitor read result according to example embodiments.

FIG. 9 is a diagram illustrating an example in which on-cells are counted according to a monitor read result. FIG. 9 may be the same as FIG. 6 except the monitor voltage VFYM2, a fifth area A5, and a sixth area A6 are further illustrated, and a duplicated description is thus omitted.

Referring to FIGS. 2, 7, and 9, a monitor voltage VFYM (e.g., VFYM2) may be lower than the erase verification voltage VFYE. For example, the monitor voltage VFYM2 may be a mid-point value of a threshold voltage distribution corresponding to the first memory block BLK1. When a read operation is performed using the monitor voltage VFYM2, memory cells, which belong to the fifth and sixth areas A5 and A6, from among memory cells in the threshold voltage distribution corresponding to the first memory block BLK1 may be determined as on-cells. Memory cells, which belong to the sixth area A6, from among memory cells in a threshold voltage distribution corresponding to the second memory block BLK2 may be determined as on-cells. Accordingly, when a second threshold voltage TH2 is determined as a value between the number of memory cells corresponding to the sixth area A6 and the number of memory cells corresponding to the fifth and sixth areas A5 and A6, whether a threshold voltage distribution of memory cells of an erase state E is normal or abnormal may be determined by the monitor read operation. For example, it may be determined that a memory block (e.g., the first memory block BLK1) having a third number of memory cells in the fifth area A5 and the sixth area A6 is in a normal state and a memory block (e.g., the second memory block BLK2) having a fourth number of memory cells smaller than the third number of memory cells in the sixth area A6 is in an abnormal state.

Figure 10:
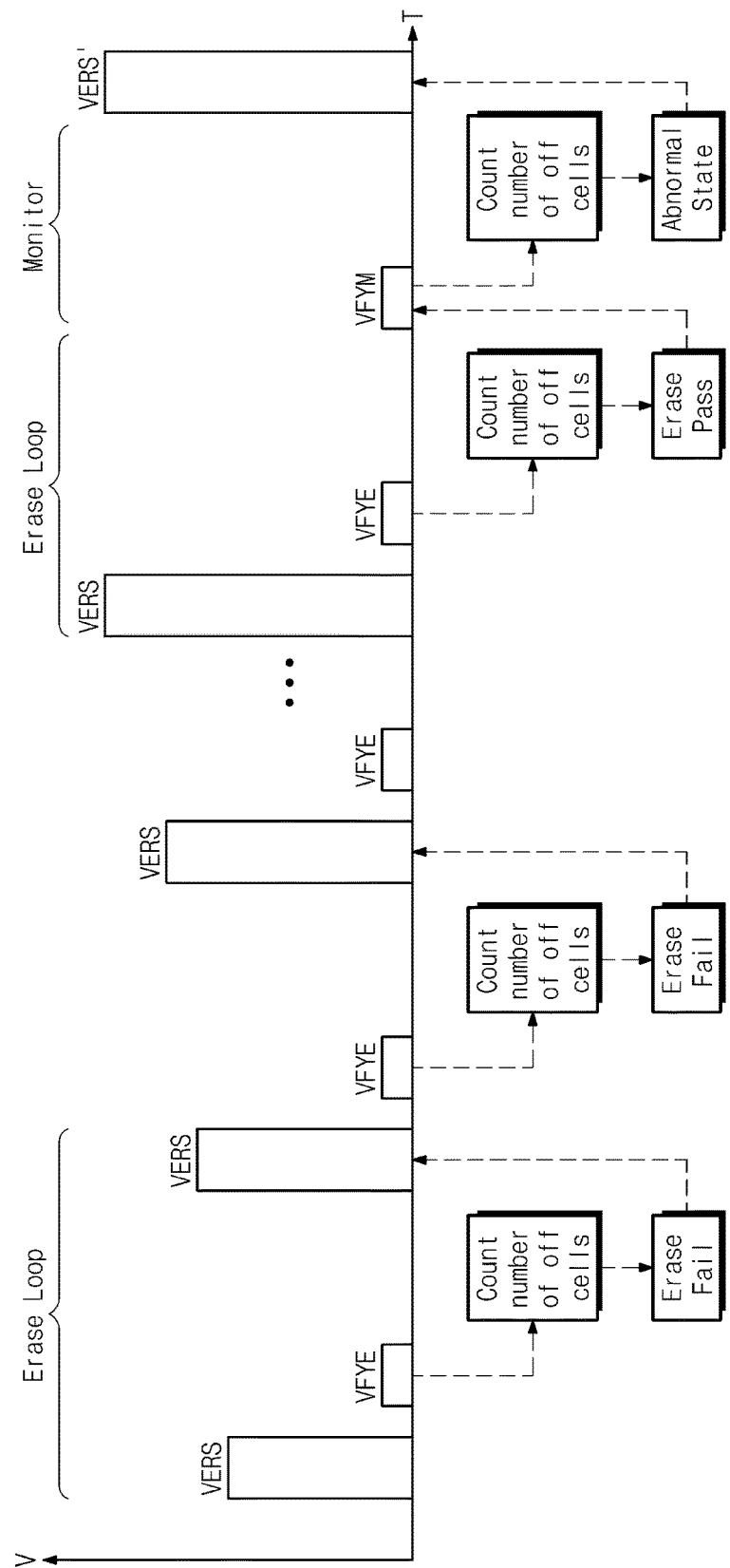
FIG. 10 is a timing diagram illustrating a procedure in which an erase operation, a monitor read operation, and application of an extra erase voltage are performed, according to example embodiments.

FIG. 10 is a timing diagram illustrating a procedure in which an erase operation, a monitor read operation, and application of an extra erase voltage are performed, according to example embodiments. In FIG. 10, the abscissa represents a time T, and the ordinate represents a voltage V applied to memory cells. Operations which are performed with regard to a voltage applied to memory cells are illustrated at the bottom of FIG. 10.

Referring to. FIGS. 1, 2, and 10, each erase loop may include an erase section and an erase verification section. In the erase section, the erase voltage VERS may be applied to memory cells. In the erase verification section, there may be performed the following: and erase verification read and a pass/fail check. During the erase verification read, the erase verification voltage VFYE may be applied to the memory cells. During the pass/fail check, the number of off-cells may be counted according to a result of the erase verification read, and an erase pass or an erase fail may be determined according to a count value.

A next erase loop may be performed when the result of the pass/fail check operation indicates the erase fail. The erase voltages VERS may increase when the next erase loop is performed.

A monitor operation may be performed when the result of the pass/fail check operation indicates the erase pass. The monitor operation may include a monitor read operation and a monitor check operation. During the monitor read operation, the monitor voltage VFYM may be applied to the memory cells. During the monitor check operation, the number of off-cells (or on-cells) may be counted according to a result of the monitor read operation, and whether a threshold voltage distribution of the memory cells is normal or abnormal may be determined according to the count result (i.e., a count value).

If the result of the monitor read operation indicates that the threshold voltage distribution of the memory cells is abnormal, an extra erase voltage VERS' may be applied to the memory cells. For example, the extra erase voltage VERS' may be applied to bodies of all memory cells in a memory block which is an erase target. A level of the extra erase voltage may be the same as, lower, or higher than that of an erase voltage of the last (or most recent) erase loop.

If the result of the monitor read operation indicates that the threshold voltage distribution of the memory cells is normal, a process associated with the erase operation may end.

Figure 11:
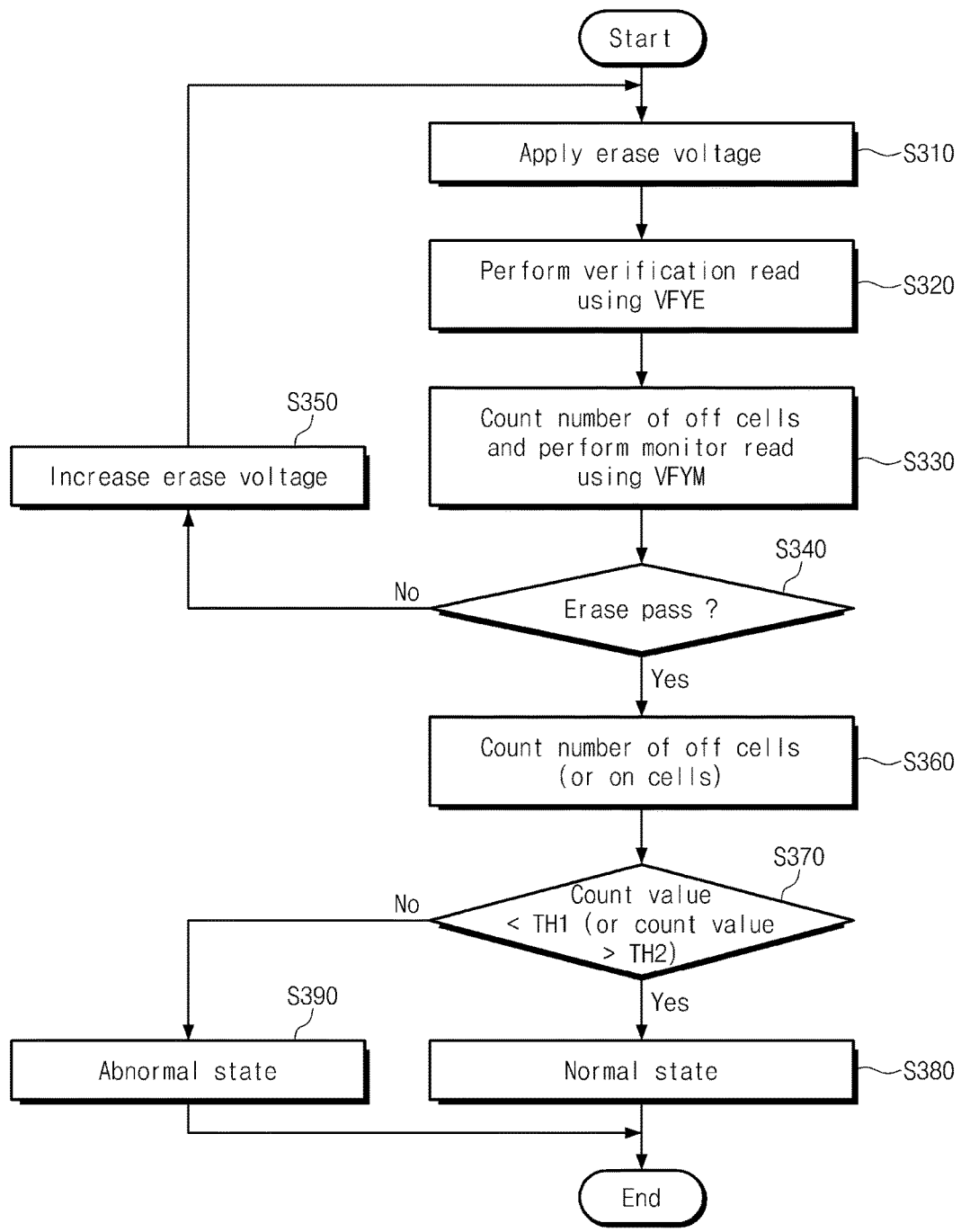
FIG. 11 is a flow chart illustrating an application of an operating method of FIG. 6 according to example embodiments.

FIG. 11 is a flow chart illustrating an application of an operating method of FIG. 6 according to example embodiments; Referring to FIGS. 1, 2, and 11, in step S310, an erase voltage may be applied to memory cells. In step S320, a verification read operation may be performed using the erase verification voltage VFYE. Operations of steps S310 and S320 may be similar to those of steps S110 and S120.

In step S330, while the pass/fail check circuit PFC counts a number of off-cells based on a result of a verification read operation, the control logic circuit 119 may control the row decoder circuit 113 and the page buffer circuit 115 so as to perform a monitor read operation using the monitor voltage VFYM. An operation of step S330 where off-cells are counted may be performed in a manner similar to that of step S130. An operation of step S330 where the monitor read operation is performed may be performed in a manner similar to that of step S210. In example embodiments, while the pass/fail check circuit PFC counts the number of off-cells based on a result of the verification read operation, the control logic circuit 119 may perform the monitor read operation using the monitor voltage VFYM.

In step S340, an erase pass or an erase fail may be determined according to a result of counting off-cells. If the erase fail is determined, the procedure may proceed to step S350, in which the erase voltage is increased. Afterwards, the procedure may proceed to step S310. If the erase fail is determined, the result of the monitor read operation may be ignored, and the page buffer circuit 115 may be reset. If the erase pass is determined, the procedure may proceed to step S360. Operations of steps S340 and S350 may be similar to those of steps S140 and S150.

If the erase pass is determined, the pass/fail check circuit PFC may receive the result of the monitor read operation from the page buffer circuit 115. In step S360, the pass/fail check circuit PFC may count the number of off-cells (or on-cells). In step S370, the pass/fail check circuit PFC may determine whether the count result (e.g., a count value) is smaller than the first threshold value TH1 (or greater than the second threshold value TH2). If the count value is smaller than the first threshold value TH1 (or greater than the second threshold value TH2), in step S380, the pass/fail check circuit PFC may determine a threshold voltage distribution as being at a normal state. If the count value is not smaller than the first threshold value TH1 (or not greater than the second threshold value TH2), in step S390, the pass-fail check circuit PFC may determine a threshold voltage distribution as being an abnormal state. Operations of steps S360 to S390 may be similar to those of steps S220 to S250.

Figure 12:
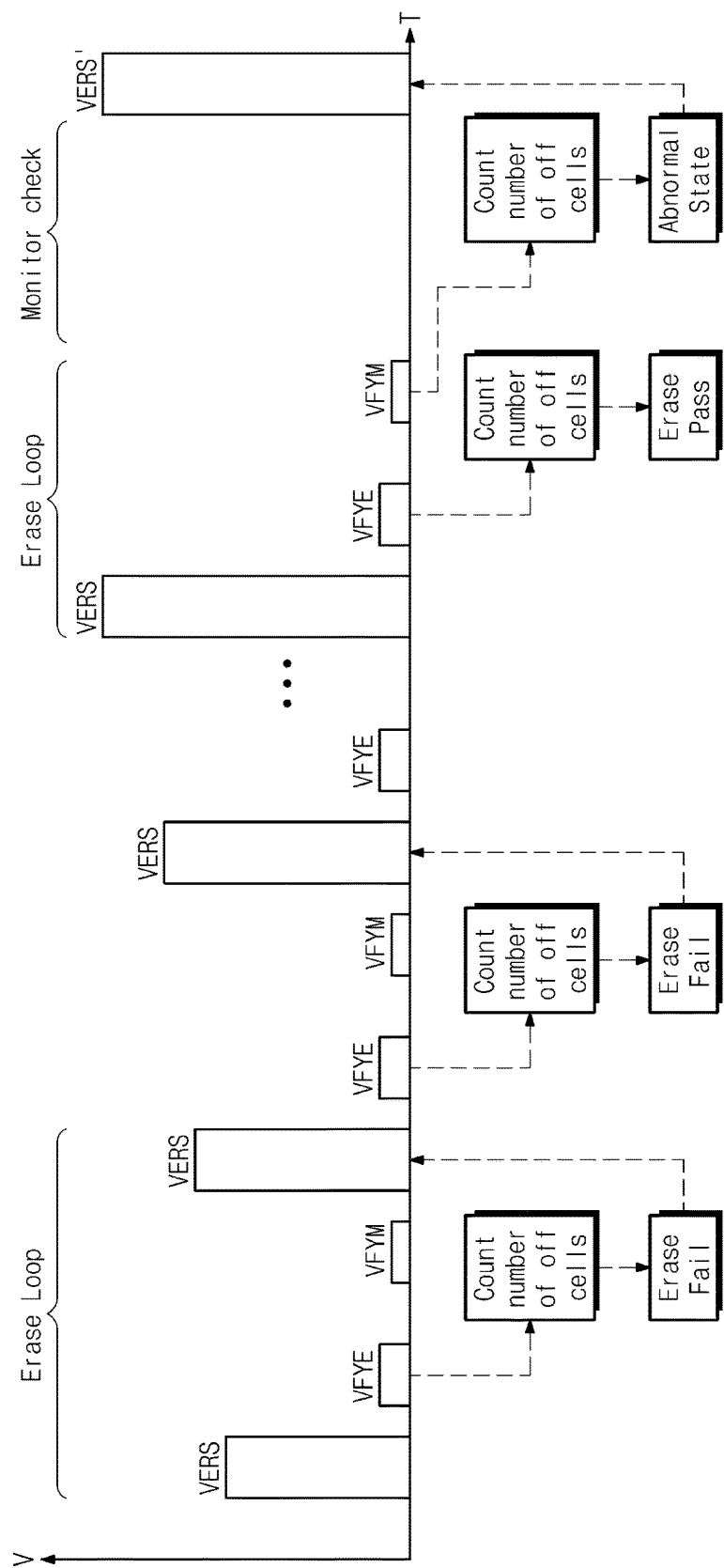
FIG. 12 is a timing diagram illustrating a procedure in which an erase operation, a monitor read operation, and application of an extra erase voltage are performed, according to an application of FIG. 11.

FIG. 12 is a timing diagram illustrating a procedure in which an erase operation, a monitor read operation, and application of an extra erase voltage are performed, according to an application of FIG. 11. In FIG. 12, the abscissa represents a time T, and the ordinate represents a voltage V applied to memory cells. Operations which are performed with regard to a voltage applied to memory cells are illustrated at the bottom of FIG. 12.

Referring to FIGS. 1, 2, and 12, each erase loop may include an erase section and an erase verification section. In the erase section, the erase voltage VERS may be applied to memory cells. In the erase verification section, there may be performed the following: an erase verification read and a pass-fail check. During the verification read, the erase verification voltage VERS may be applied to the memory cells. During the pass/fail check, the number of off-cells may be counted according to a result of the erase verification read, and an erase pass or an erase fail may be determined according to a count value.

A monitor read operation using the monitor voltage VFYM may be performed in parallel with the pass/fail check. In an embodiment, the monitor read operation may be included as a portion of the erase loop.

A next erase loop may be performed when the result of the pass/fail check operation indicates an erase fail. The erase voltages VERS may increase when the next erase loop is performed. Furthermore, a result of the monitor read operation using the monitor voltage VFYM may be ignored.

A monitor check operation may be performed when the result of the pass/fail check operation indicates the erase pass. During the monitor check operation, the number of off-cells (or on-cells) may be counted according to a result of the monitor read operation, and whether a threshold voltage distribution of the memory cells is normal or abnormal may be determined according to the count result (i.e., a count value).

If the result of the monitor check operation indicates that the threshold voltage distribution of the memory cells is abnormal, an extra erase voltage VERS' may be applied to the memory cells. For example, the extra erase voltage VERS' may be applied to channels of all memory cells in a memory block as an erase target. A level of the extra erase voltage may be the same as, lower, or higher than that of an erase voltage of the last erase loop.

If the result of the monitor check operation indicates that the threshold voltage distribution of the memory cells is normal, a process associated with the erase operation may end without applying the extra erase voltage to the memory cells.

A timing diagram of FIG. 12 may differ from that of FIG. 10 in that the monitor read operation is performed while the pass/fail check is performed. Since the monitor read operation and the pass/fail check operation are performed in parallel with each other, the erase loop may not be delayed. Furthermore, when the erase pass is determined, the procedure may proceed directly to a monitor check operation without a need to perform a monitor read operation separately. This may make it possible to reduce a time taken to determine whether to apply an extra erase voltage VERS'.

Figure 13:
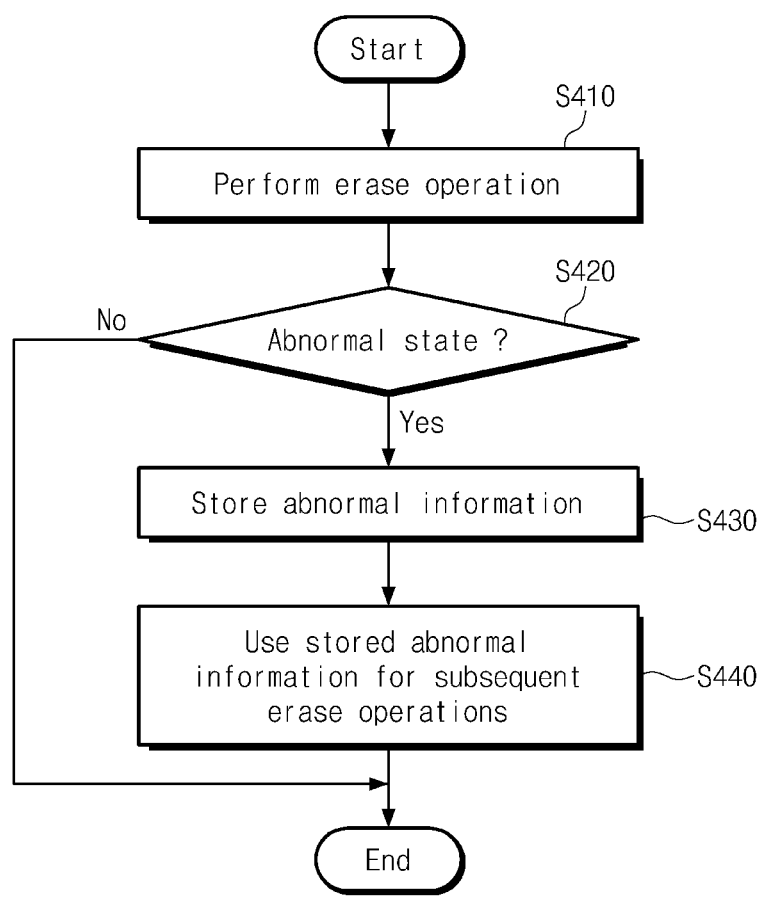
FIG. 13 is a flow chart illustrating a method in which a nonvolatile memory device manages abnormal information, according to example embodiments.

FIG. 13 is a flow chart illustrating a method in which a nonvolatile memory device 110 manages abnormal information, according to example embodiments. Referring to FIGS. 1, 2, and 13, in step S410, the nonvolatile memory device 110 may perform an erase operation with respect to memory cells of a selected memory block.

In step S420, the nonvolatile memory device 110 may determine whether the selected memory block is at a normal state or an abnormal state. For example, step S420 may be performed after the monitor check operation described with reference to FIGS. 6, 7, and 11 ends. If the selected memory block is determined as being at the normal state, the nonvolatile memory device 110 may not perform the following operation associated with abnormal information. If the selected memory block is determined as being at the abnormal state, step S430 may be performed.

In step S430, the nonvolatile memory device 110 may store abnormal information indicating that the selected memory block is at the abnormal state. The abnormal information may be stored in spare memory cells, which store spare information, from among memory cells in the selected memory block, memory cells of a meta memory block storing meta information, or a register in the control logic circuit 119. The abnormal information may correspond to an address of the selected memory block.

In step S440, the nonvolatile memory device 110 may use the abnormal information at the following erase operations of a memory block associated with the abnormal state. For example, the nonvolatile memory device 110 may select a second memory block to be erased, based on an erase command and an address from an external device (e.g., a controller). The nonvolatile memory device 110 may determine whether the abnormal information associated with the selected second memory block is stored in the memory cell array 111 or the control logic circuit 119. If the abnormal information associated with the selected second memory block is determined as being stored therein, the nonvolatile memory device 110 may not perform a monitor read operation after performing an erase operation on the second memory block or while performing an erase operation. After performing the erase operation, the nonvolatile memory device 110 may apply an extra erase voltage to channels of memory cells in the second memory block without performing the monitor check operation.

If the abnormal information associated with the selected second memory block is determined as being not stored therein, the nonvolatile memory device 110 may perform an erase operation and a process associated with the erase operation as described with reference to FIGS. 6 to 12. Here, the process associated with the erase operation may include performing a monitor read operation, a monitor check operation, and selectively applying an extra erase voltage based on a result of the monitor check operation.

Figure 14:
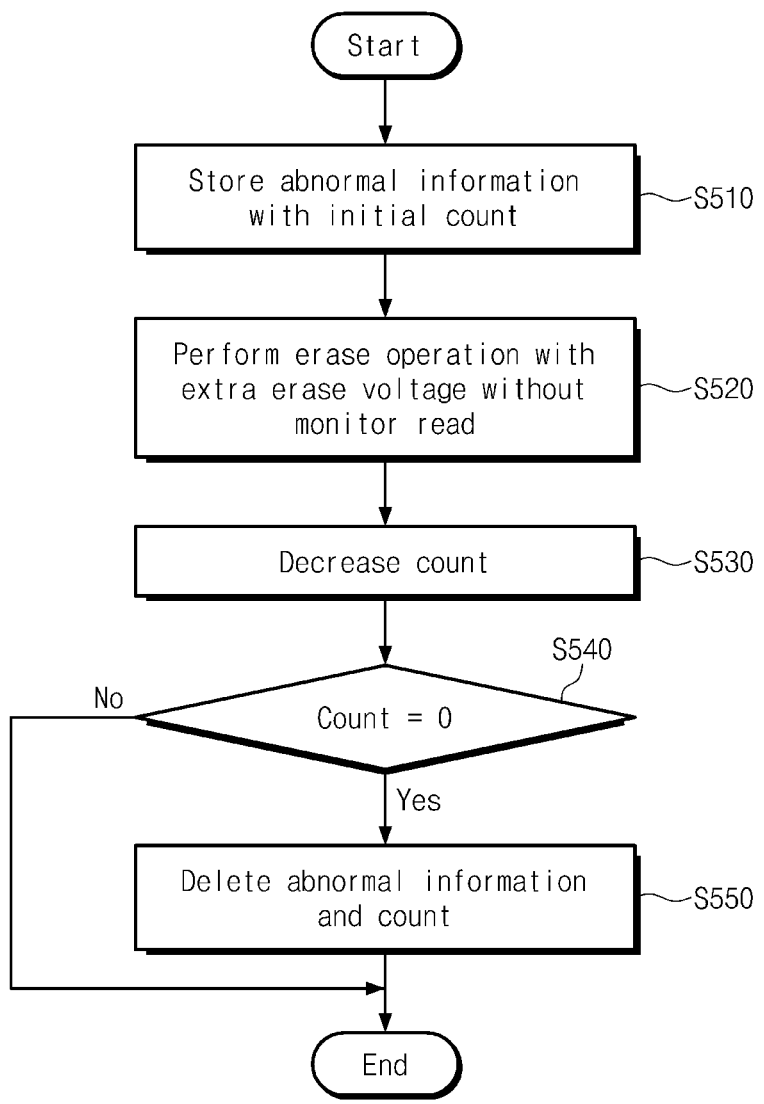
FIG. 14 is a flow chart illustrating a method in which a nonvolatile memory device deletes abnormal information, according to example embodiments.

FIG. 14 is a flow chart illustrating a method in which a nonvolatile memory device 110 deletes abnormal information, according to example embodiments. Referring to FIGS. 1, 2, and 14, in step S510, the nonvolatile memory device 110 may store abnormal information together with an initial count. For example, the initial count may be a positive integer. For other example, the initial count may be "1."

In step S520, the nonvolatile memory device 110 may perform an erase operation on a memory block associated with the abnormal information, in response to a request of an external device (e.g., a controller). Based on the stored abnormal information, the nonvolatile memory device 110 may apply an extra erase voltage after an erase pass is determined. At this time, the nonvolatile memory device 110 may not perform a monitor read operation and a monitor check operation.

In step S530, the nonvolatile memory device 110 may decrease a count from the initial count. For example, the count may be decreased by 1.

In step S540, whether a count of a memory block where an erase operation is performed is "0" may be determined based on the abnormal information. If the count is not "0", the abnormal information may be retained with a decreased state, not deleted. If the count is "0", in step S550, the nonvolatile memory device 110 may delete the abnormal information and the count.

A characteristic variation among memory blocks BLK1 to BLKz may occur due to a pattern of data written at the memory blocks BLK1 to BLKz as well as a physical characteristic variation among the memory blocks BLK1 to BLKz. For example, if an erase operation is performed after data of a change pattern causing a characteristic change is written at the memory block BLKa, a threshold voltage distribution of an erase state E of the memory block BLKa may be changed from an original state. For example, a threshold voltage distribution of the memory cells in the first memory block BLK1 may be changed to a threshold voltage distribution of the memory cells in the second memory block BLK2. Afterwards, if a program operation of data of a normal pattern and an erase operation are repeated with respect to the memory block BLKa by a specific frequency, a threshold voltage distribution of the erase state E of the memory block BLKa may be returned to an original state. For example, a threshold voltage distribution of the memory cells in the second memory block BLK2 illustrated in FIG. 5 may be returned to a threshold voltage distribution of the memory cells in the first memory block BLK1.

Accordingly, as described with reference to FIG. 14, if abnormal information is deleted when a program operation and an erase operation are repeated as many as an initial count after a specific memory block is determined as being abnormal, it may be possible to prevent an extra erase voltage from being applied after a threshold voltage distribution of the specific memory block is restored.

In an embodiment, a normal pattern may be a pattern having the degree of randomness being greater than or equal to a threshold value, and the change pattern may be a pattern having the degree of randomness being smaller than the threshold value.

Figure 15:
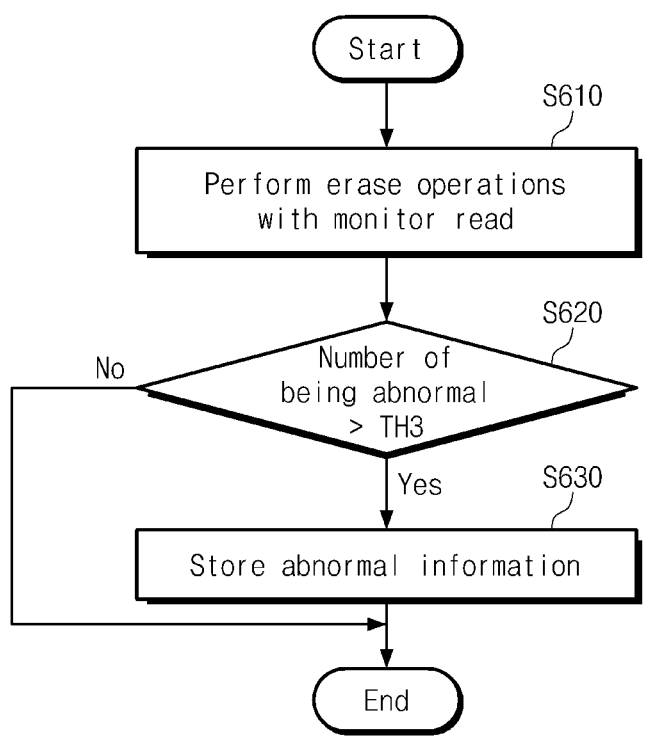
FIG. 15 is a flow chart illustrating a method in which a nonvolatile memory device manages abnormal information, according to example embodiments.

FIG. 15 is a flow chart illustrating a method in which a nonvolatile memory device 110 manages abnormal information, according to example embodiments. Referring to FIGS. 1, 2, and 15, in step S610, the nonvolatile memory device 110 may perform an erase operation with respect to a selected memory block. With regard to the erase operation, the nonvolatile memory device 110 may perform a monitor read operation, a monitor check operation and an operation of selectively applying an extra erase voltage based on a result of the monitor read operation and the monitor check operation.

In step S620, the nonvolatile memory device 110 may determine whether the number of events that the selected memory block is determined as being at an abnormal state is greater than a third threshold value TH3. For example, the nonvolatile memory device 110 may compare the number of continuous events that the selected memory block is determined as being at an abnormal state or the number of discontinuous and/or continuous events that the selected memory block is determined as being at an abnormal state with the third threshold value TH3.

If the number of events thus determined is smaller than or equal to the third threshold value TH3, the nonvolatile memory device 110 may not store the abnormal information. If the number of events thus determined is greater than the third threshold value TH3, the nonvolatile memory device 110 may store the abnormal information associated with the selected memory block.

For example, the nonvolatile memory device 110 may store the abnormal information. Afterwards, the nonvolatile memory device 110 may delete the abnormal information in a method described with reference to FIG. 14. As another example, the nonvolatile memory device 110 may determine and manage the selected memory block to be an abnormal block. For example, an erase operation on the abnormal block may accompany an operation of applying an extra erase voltage without a monitor read operation and a monitor check operation.

Figure 16:
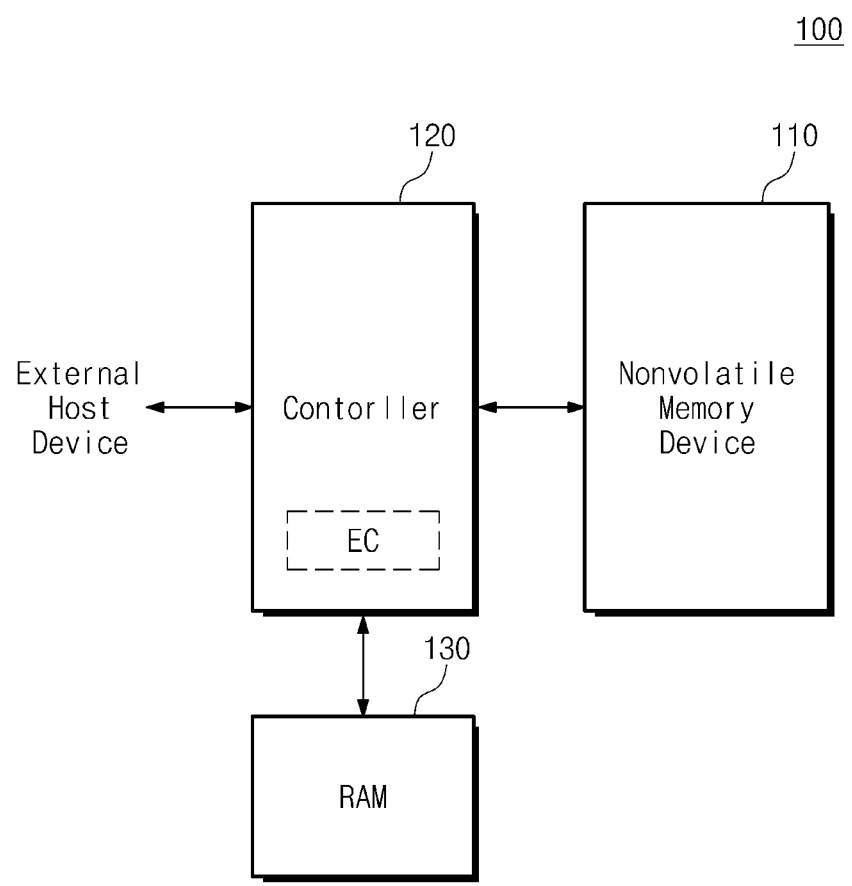
FIG. 16 is a block diagram illustrating a storage device according to example embodiments.

FIG. 16 is a block diagram illustrating a storage device 100 according to example embodiments. Referring to FIG. 16, a storage device 100 may include a nonvolatile memory device 110, a controller 120, and a random access memory (RAM) 130.

The nonvolatile memory device 110 may perform a write, read or erase operation under control of the controller 120. The nonvolatile memory device 110 may receive a command and an address from the controller 120 through an input/output channel. The nonvolatile memory device 110 may exchange data with the controller 120 through the input/output channel.

The nonvolatile memory device 110 may exchange a control signal with the controller 120 through a control channel. For example, the nonvolatile memory device 110 may receive, from the controller 120, at least one of a chip enable signal /CE for selecting at least one of a plurality of nonvolatile memory chips in the nonvolatile memory device 110, a command latch enable signal CLE indicating that a signal received from the controller 120 through the input/output channel is the command, an address latch enable signal ALE indicating that a signal received from the controller 120 through the input/output channel is an address, a read enable signal /RE generated by the controller 120 at a read operation, periodically toggled, and used to tune timing, a write enable signal /WE activated by the controller 120 when the command or the address is transferred, a write protection signal /WP activated by the controller 120 to prevent unintended writing or erasing when a power changes, and a data strobe signal DQS used to adjust input synchronization with the data transferred through the input/output channel and generated from the controller 120 at a write operation so as to be periodically toggled. For example, the nonvolatile memory device 110 may output, to the controller 120, at least one of a ready/busy signal R/nB indicating whether the nonvolatile memory device 110 is performing a program, erase or read operation and a data strobe signal DQS used to adjust output synchronization with the data and generated from the read enable signal /RE by the nonvolatile memory device 110 so as to be periodically toggled.

The nonvolatile memory device 110 may include a flash memory. However, the scope and spirit of the disclosure may not be limited thereto. For example, the nonvolatile memory device 110 may incorporate at least one of nonvolatile memory devices, such as a phase-change RAM (PRAM), a magnetic RAM (MRAM), a resistive RAM (RRAM), and a ferroelectric RAM (FeRAM).

The memory controller 120 may be configured to access the nonvolatile memory device 110. For example, the controller 120 may control the nonvolatile memory device 110 through an input/output channel and a control channel so as to perform a write, read or erase operation.

The controller 120 may control the nonvolatile memory device 110 under control of an external host device (not illustrated). For example, the controller 120 may communicate with the external host device based on the format different from the format for communications with the nonvolatile memory device 110. A unit of data which the controller 120 conveys to the nonvolatile memory device 110 may be different from a unit of data which the controller 120 conveys to the external host device.

The controller 120 may use the RAM 130 as a working memory, a buffer memory, or a cache memory. The controller 120 may store data or codes, needed to manage the nonvolatile memory device 110, at the RAM 130. For example, the controller 120 may read data or codes, needed to manage the nonvolatile memory device 110, from the nonvolatile memory device 110 and may load the read data or codes on the RAM 130 for driving.

The RAM 130 may include at least one of a variety of random access memories, such as, but not limited to, a static RAM (SRAM), a dynamic RAM (DRAM), a synchronous DRAM (SRAM), a PRAM, a MRAM, a RRAM, and a FRAM.

The nonvolatile memory device 110 may include a plurality of nonvolatile memory chips. In an embodiment, the controller 120 and the nonvolatile memory chips may be interconnected based on a channel and a way. One channel may include one data channel and one control channel. One data channel may include eight data lines. One control channel may include control lines for transferring the chip enable signal (/CE), the command latch enable signal (CLE), the address latch enable signal (ALE), the read enable signal (/RE), the write enable signal (/WE), the write protect signal (/WP), and the ready/busy signal (R/nB).

Nonvolatile memory chips connected to one channel may constitute a way. When being connected to one channel, n nonvolatile memory chips may compose an n-way. Nonvolatile memory chips belonging to one way may share data lines and the control lines for transferring the command latch enable signal CLE, the address latch enable signal ALE, the read enable signal /RE, the write enable signal /WE, and the write protect signal /WP. Each of nonvolatile memory chips belonging to one way may communicate with the controller 120 through control lines dedicated to the chip enable signal /CE and the ready/busy signal R/nB.

The controller 120 may alternately access n-way nonvolatile memory chips connected to one channel. The controller 120 may independently access nonvolatile memory chips connected with different channels. The controller 120 may alternately or simultaneously access nonvolatile memory chips connected with different channels.

In an embodiment, nonvolatile memory chips may be connected with the controller 120 in the form of a wide IO. For example, nonvolatile memory chips connected to different channels may share a control line for a chip enable signal /CE. Nonvolatile memory chips which share the control line for the chip enable signal /CE may be accessed at the same time. Data lines of different channels may be used at the same time, and thus a wide input/output bandwidth may be achieved.

The storage device 100 may include a solid state drive (SSD) or a hard disk drive (HDD). The storage device 100 may include memory cards, such as PC card (personal computer memory card international association (PCM-CIA)), compact flash (CF) card, smart media card (e.g., SM, SMC), memory stick, multimedia card (e.g., MMC, RS-MMC, MMCmicro), SD card (e.g., SD, miniSD, microSD, SDHC), universal serial bus (USB) memory card, and universal flash storage (UFS). The storage device 100 may include embedded memories, such as an embedded Multi-Media card (eMMC), a UFS, and a PPN (Perfect Page NAND).

In FIG. 16, an embodiment of the disclosure is exemplified as the RAM 130 is disposed outside the controller 120. However, the scope and spirit of the disclosure may not be limited thereto. For example, the storage device 100 may not include the RAM 130 disposed outside the controller 120. The controller 120 may use an internal RAM (refer to FIG. 9) as a buffer memory, a working memory, or a cache memory.

For example, the nonvolatile memory device 110 may perform the monitor read operation, the monitor check operation, and the operation of applying the erase voltage, as described with reference to FIGS. 1 to 15. As described with reference to FIGS. 13 to 15, the nonvolatile memory device 110 may manage abnormal information and may determine whether to perform a monitor read operation and a monitor check operation based on the abnormal information.

In an embodiment, the controller 120 may include an error controller EC. The error controller EC may determine whether to perform a monitor read operation and a monitor check operation with regard to an erase operation of the nonvolatile memory device 110. The nonvolatile memory device 110 may determine whether to perform the monitor read operation and the monitor check operation under control of the error controller EC.

In an embodiment, the error controller EC of the controller 120 may manage abnormal information and may control the nonvolatile memory device 110 based on the abnormal information. The nonvolatile memory device 110 may be configured to provide the abnormal information to the controller 120.

Figure 17:
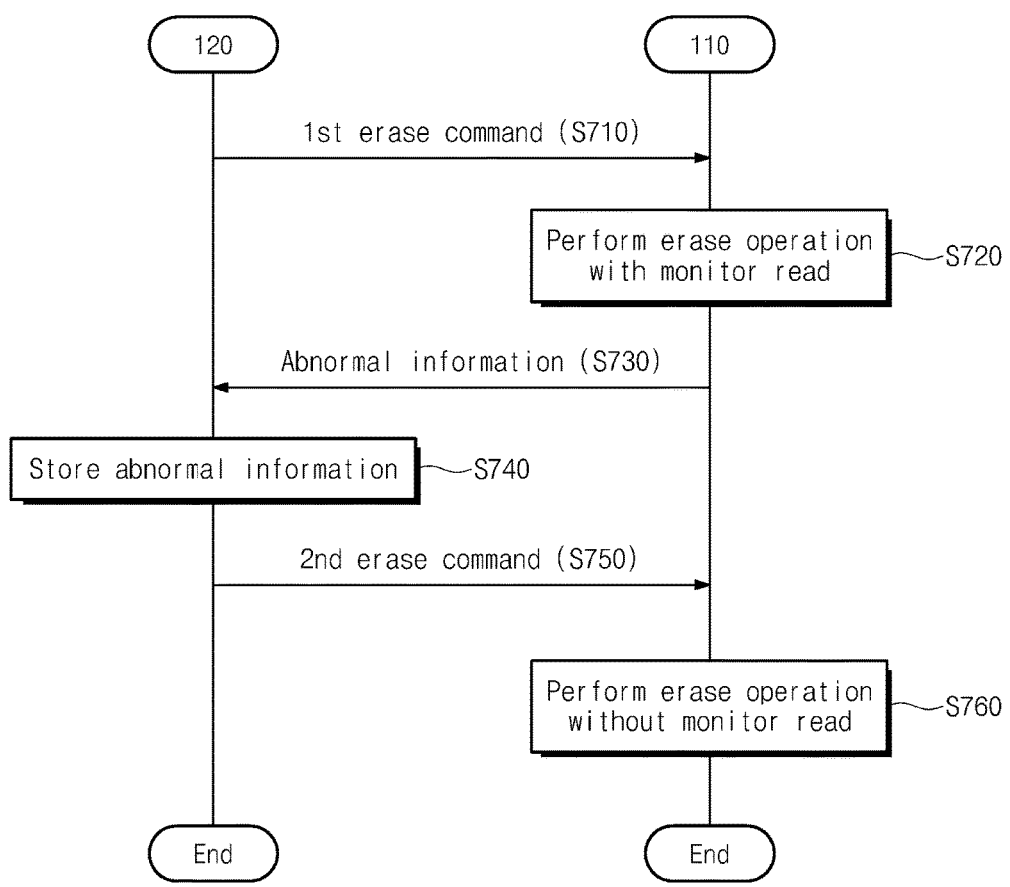
FIG. 17 is a flow chart illustrating an operating method of a storage device according to example embodiments.

FIG. 17 is a flow chart illustrating an operating method of a storage device 100 according to example embodiments. Referring to FIGS. 16 and 17, in step S710, the controller 120 may transfer a first type of erase command to the nonvolatile memory device 110. In step S720, the nonvolatile memory device 110 may perform an erase operation accompanying the monitor read operation in response to the first type of erase command. After an erase pass is determined at the erase operation, the nonvolatile memory device 110 may perform a monitor read operation, a monitor check operation and an operation of selectively applying an extra erase voltage based on a result of the monitor read operation and the monitor check operation.

If the result of the monitor check operation indicates an abnormal state, in step S720, the nonvolatile memory device 110 may transfer the abnormal information to the controller 120 in step S730. In step S740, the controller 120 may store the abnormal information received from the nonvolatile memory device 110.

When an erase operations on a memory block where abnormal information is stored is requested, the controller 120 may transfer a second type of erase command to the nonvolatile memory device 110 in step S750. In step S760, the nonvolatile memory device 110 may perform an erase operation not accompanying the monitor read operation in response to the second type of erase command. For example, after an erase pass is determined at the erase operation, the nonvolatile memory device 110 may apply an extra erase voltage without execution of a monitor read operation and a monitor check operation.

In an embodiment, as described with reference to FIG. 14, the controller 120 may manage a count associated with the abnormal information and may delete the abnormal information based on a count.

In an embodiment, as described with reference to FIG. 15, when the number of memory cells of a specific memory block is received is greater than or equal to a threshold value, the controller 120 may transfer the second type of erase command to the specific memory block.

Figure 18:
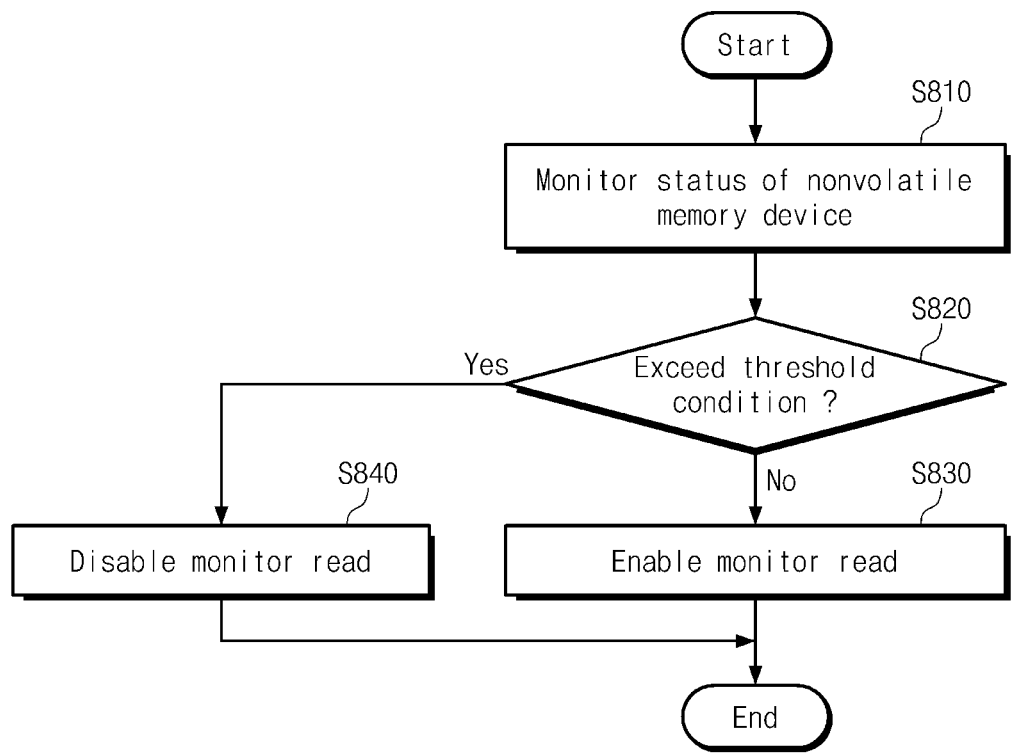
FIG. 18 is a flow chart illustrating a method in which a storage device controls a monitor read operation based on an environment condition according to example embodiments.

FIG. 18 is a flow chart illustrating a method in which a storage device 100 controls a monitor read operation based on an environment condition according to example embodiments. Referring to FIGS. 16 and 18, in step S810, the controller 120 may monitor a status of the nonvolatile memory device 110. For example, the controller 120 may monitor the number of program/erase cycles of each memory block of the nonvolatile memory device 110 or a pattern of data programmed at each memory block.

In step S820, the controller 120 may determine whether a monitored status reaches a threshold condition. For example, the controller 120 may determine whether the number of program/erase cycles of each memory block is greater than a reference value. The controller 120 may determine whether the degree of randomness of a pattern of data written at each memory block is smaller than the reference value.

If the monitored status is determined as not reaching the threshold condition, in step S830, the controller 120 may enable a monitor read operation on a memory block of which the monitored status does not reach the threshold condition. For example, the controller 120 may provide the nonvolatile memory device 110 with control information which requests the nonvolatile memory device 110 to perform an erase operation together with a monitor read operation with respect to a memory block of which the monitored status reaches the threshold condition. The nonvolatile memory device 110 may store the control information received from the controller 120. When there is requested an erase operation of a memory block corresponding to control information received from the controller 120, the nonvolatile memory device 110 may perform the erase operation at the corresponding memory block and may perform a monitor read operation, a monitor check operation, and an operation of selectively applying an extra erase voltage based on a result of the monitor check operation. For another example, when requesting an erase operation on a memory block, of which the monitored status reaches the threshold condition, from the nonvolatile memory device 110, the controller 120 may provide the nonvolatile memory device 110 with the first type of erase command (refer to FIG. 17).

If the monitored status is determined as reaching the threshold condition, in step S840, the controller 120 may disable a monitor read operation on a memory block of which the monitored status reaches the threshold condition. For example, the controller 120 may provide the nonvolatile memory device 110 with control information which requests the nonvolatile memory device 110 not to perform a monitor read operation in performing an erase operation on a memory block of which the monitored status reaches the threshold condition. The nonvolatile memory device 110 may store the control information received from the controller 120. When there is requested an erase operation of a memory block corresponding to control information received from the controller 120, the nonvolatile memory device 110 may perform the erase operation at the corresponding memory block and may perform an operation of selectively applying an extra erase voltage without execution of a monitor read operation and a monitor check operation. For another example, when requesting an erase operation on a memory block, of which the monitored status reaches the threshold condition from the nonvolatile memory device 110, the controller 120 may provide the nonvolatile memory device 110 with the second type of erase command (refer to FIG. 17).

For example, the threshold condition may be determined by the number of program/erase cycles of each memory block or pattern of data to be written into each memory block.

Figure 19:
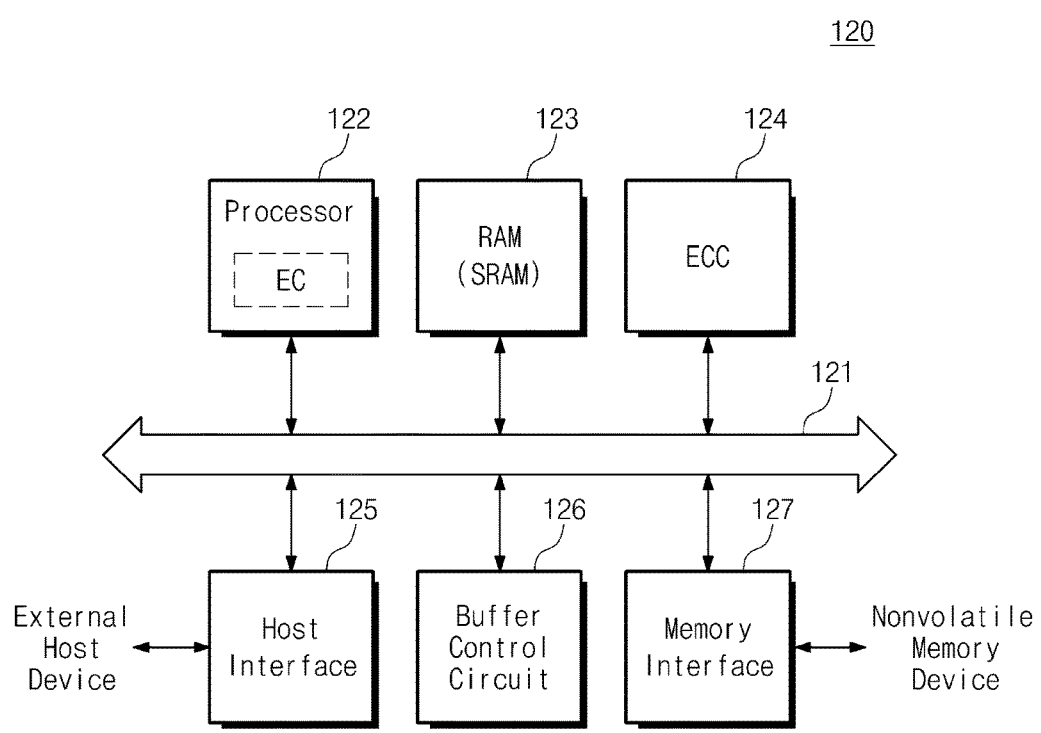
FIG. 19 is a block diagram illustrating a controller according to certain embodiments.

FIG. 19 is a block diagram schematically illustrating a controller 120 according to certain embodiments. Referring to FIG. 19, the controller 120 may include a bus 121, a processor 122, a RAM 123, an ECC block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125, may communicate with the nonvolatile memory package 110 through the memory interface 127, and may communicate with the RAM 130 through the buffer control circuit 126. The processor 122 may control the storage device 100 using the RAM 123 as a working memory, a cache memory, or a buffer memory.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include a static RAM (SRAM).

The ECC block 124 may perform an error correction operation. The ECC block 124 may perform error correction encoding based on data to be written at the nonvolatile memory device 110 through the memory interface 127. The error correction encoded data may be transferred to the nonvolatile memory device 110 through the memory interface 127. The ECC block 124 may perform error correction decoding on data received through the memory interface 127 from the nonvolatile memory device 110. In an embodiment, the ECC block 124 may be included in the memory interface 127 as a component of the memory interface 127.

The host interface 125 may communicate with the external host device under control of the processor 122. The host interface 125 may convey communications using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 126 may control the RAM 130 under a control of the processor 122

The memory interface 127 may communicate with the nonvolatile memory device 110 disclosed herein in response to control of the processor 122. As described with reference to FIG. 1, the memory interface 127 may convey a command, an address, and data to the nonvolatile memory device 110 through the input/output channel. The memory interface 127 may convey a control signal to the nonvolatile memory device 110 through the control channel.

In an embodiment, in the case where the storage device 100 does not include the RAM 130, the controller 120 may not include the buffer control circuit 126.

In an embodiment, the processor 122 may control the controller 120 using codes. The processor 122 may load codes from a nonvolatile memory device (e.g., a read only memory) that is implemented in the controller 120. Alternatively, the processor 122 may load codes from the nonvolatile memory device 110 through the memory interface 127.

In an embodiment, the bus 121 of the controller 120 may be divided into a control bus and a data bus. In an embodiment, the data bus may transfer data in the controller 120, and the control bus may transfer the following control information in the controller 120: a command and an address. The data bus and the control bus may be independent of each other to prevent mutual interference or influence. The data bus may be connected with the ECC block 124, the host interface 125, the buffer control circuit 126, and the memory interface 127. The control bus may be connected with the processor 122, the RAM 123, the host interface 125, the buffer control circuit 126, and the memory interface 127.

In an embodiment, the error controller CC may be implemented in the form of software driven by the processor 122, hardware provided as a portion of the processor 122, or a combination of hardware and software.

Figure 20:
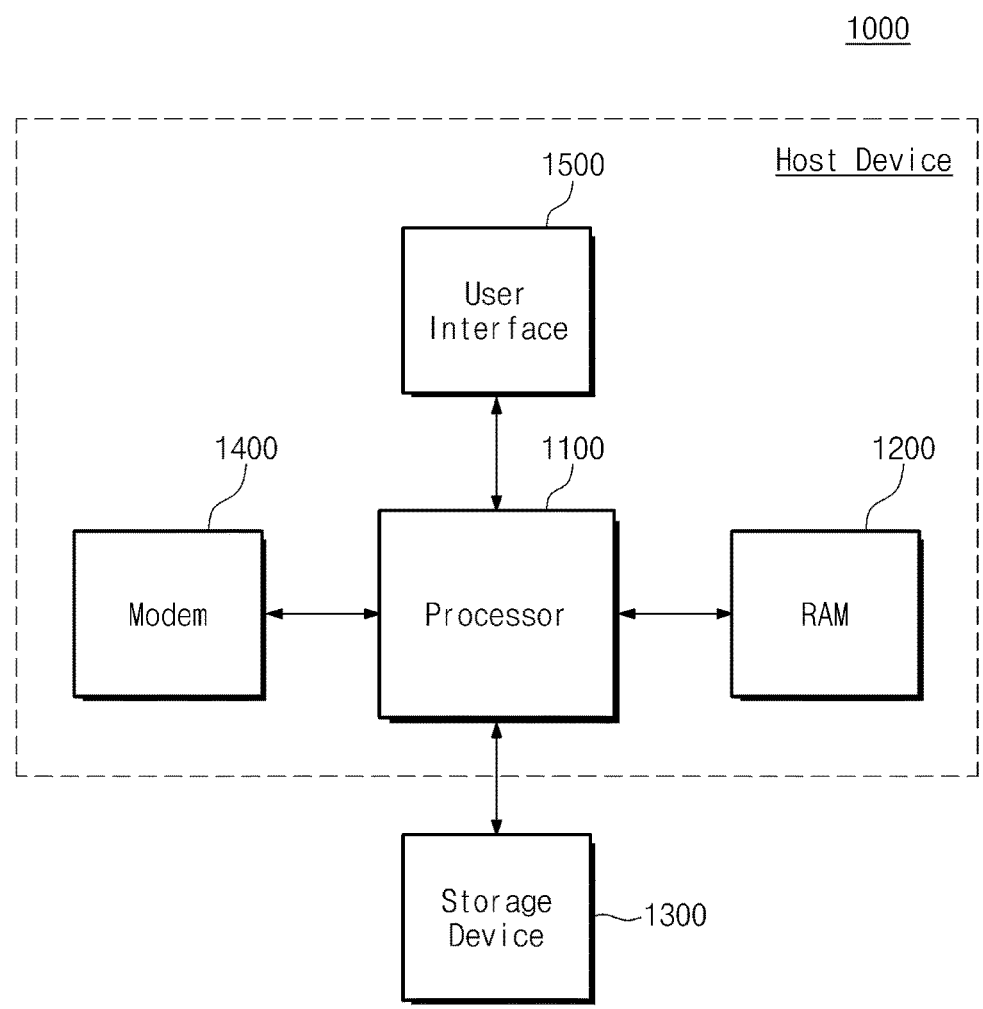
FIG. 20 is a block diagram illustrating a computing device 1000 according to certain embodiments.

FIG. 20 is a block diagram illustrating a computing device 1000 according to certain embodiments. Referring to FIG. 20, a computing device 1000 may include a processor 1100, a RAM 1200, a storage device 1300, a modem 1400, and a user interface 1500.

The processor 1100 may control an overall operation of the computing device 100 and may perform a logic operation. The processor 1100 may be a data processing device which is based on hardware including a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data at the RAM 1200 temporarily. The processor 1100 may execute codes using the RAM 1200 and may process data. The processor 1100 may execute a variety of software, such as an operating system and an application, using the RAM 1200. The processor 1100 may control an overall operation of the computing device 1000 using the RAM 1200. The RAM 1200 may include a volatile memory such as a static RAM (SRAM), a DRAM, or a synchronous DRAM (SDRAM) or a nonvolatile memory such as a phase-change RAM (PRAM), a magnetic RAM (MRAM), a resistive RAM (RRAM), or a ferroelectric RAM (FRAM).

The storage device 1300 may communicate with the processor 1100. The storage device 1300 may be used to store data for a long time. That is, the processor 110 may store data, which is to be stored for a long time, at the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In an embodiment, the processor 1100 may load source codes stored at the storage device 1300 onto the RAM 1200 and may execute the codes, thereby driving a variety of software, such as operating system and application. The processor 1100 may load data stored at the storage device 1300 onto the RAM 1200 and may process data loaded on the RAM 1200. The processor 1100 may store long-term data among data, stored at the RAM 1200, at the storage device 1300.

The storage device 1300 may include a nonvolatile memory such as a flash memory, a PRAM, an MRAM, an RRAM, or an FRAM.

The modem 1400 may communicate with an external device under control of the processor 1100. For example, the modem 1400 may communicate with the external device in a wired or wireless manner. The modem 1400 may communicate with the external device, based on at least one of wireless communications manners such as long term evolution (LTE), WiMax, global system for mobile communication (GSM), code division multiple access (CDMA), Bluetooth, near field communication (NFC), Wi-Fi, and radio frequency identification (RFID) or wired communications manners such as universal serial bus (USB), SATA, HSIC, SCSI, Firewire, peripheral component interconnection (PCI), PCI express (PCIe), nonvolatile memory express (NVMe), universal flash storage (UFS), secure digital (SD), SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), multimedia card (MMC), and embedded MMC (eMMC).

The user interface 1500 may communicate with a user under control of the processor 1100. For example, the user interface 1500 may include user input interfaces such as a keyboard, a keypad, buttons, a touch panel, a touch screen, a touch pad, a touch ball, a camera, a microphone, a gyroscope sensor, and a vibration sensor. The user interface 150 may further include user output interfaces such as a liquid crystal display (LCD), an organic light-emitting diode (OLED) display device, an active matrix OLED (AMOLED) display device, a light-emitting diode (LED), a speaker, and a motor.

The storage device 1300 may include the storage device 100 in FIG. 16. The processor 1100, RAM 1200, modem 1400, and user interface 1500 may constitute a host device that communicates with the storage device.

According to embodiments of the disclosure, a status of threshold voltages of erase-passed memory cells may be monitored, and an extra erase voltage may be selectively applied to the memory cells of the erase-passed memory cells based on the monitored result. Accordingly, statuses of the threshold voltages of the erase-passed memory cells may become uniform.

While the present disclosure has been described with reference to exemplary embodiments, it will be apparent to those skilled in the art that various changes and modifications may be made without departing from the spirit and scope of the disclosure as defined by the appended claims.

What is claimed is:

1. A nonvolatile memory device, comprising:
a plurality of memory blocks each comprising a plurality of memory cells;
a row decoder circuit connected to the memory cells through word lines;
a page buffer circuit connected to the memory cells through bit lines; and
a control logic circuit configured to control an erase operation of memory cells in a first memory block selected from the memory blocks,
wherein the erase operation comprises iteratively performing an erase loop which comprises an erase section in which an erase voltage is applied to the memory cells of the first memory block and an erase verification section in which the memory cells of the first memory block are verified using a first read voltage,
wherein the control logic circuit is configured such that if the memory cells of the first memory block are determined as an erase pass in the erase verification section, the control logic circuit controls a read of the memory cells of the first memory block using a second read voltage different from the first read voltage,
wherein the control logic circuit is configured to apply an extra erase voltage to the memory cells of the first memory block based on a result of the read of the memory cells of the first memory block using the second read voltage, and
wherein the nonvolatile memory device is configured such that threshold voltages of the memory cells of the first memory block when the extra erase voltage is applied to the memory cells of the first memory block are lower than corresponding threshold voltages of the memory cells of the first memory block when an erase voltage of a most recent previous erase loop is applied to the memory cells of the first memory block.

2. The nonvolatile memory device of claim 1, wherein the second read voltage is lower than the first read voltage.

3. The nonvolatile memory device of claim 2, wherein the control logic circuit is configured such that when a number of off-cells turned off when the read is performed is greater than a threshold value based on the result of the read of the memory cells of the first memory block using the second read voltage, the control logic circuit applies the extra erase voltage to the memory cells of the first memory block.

4. The nonvolatile memory device of claim 2, wherein the control logic circuit is configured such that when a number of on-cells turned on when the read is performed is smaller than a threshold value based on the result of the read of the memory cells of the first memory block using the second read voltage, the control logic circuit applies the extra erase voltage to the memory cells of the first memory block.

5. The nonvolatile memory device of claim 2, wherein the erase verification section comprises a verification read in which the memory cells of the first memory block are read using the first read voltage and a pass/fail check in which an erase pass or an erase fail is determined according to a result of the verification read, and wherein the control logic circuit is configured such that when the pass/fail check in the erase verification section is performed, the control logic circuit controls the row decoder circuit and the page buffer circuit so as to perform the read of the memory cells of the first memory block using the second read voltage.

6. The nonvolatile memory device of claim 5, wherein the control logic circuit is configured such that when a result of the pass/fail check is indicated as an erase fail, the control logic circuit controls the erase operation so as to perform a next erase loop regardless of a result of the read performed using the second read voltage.

7. The nonvolatile memory device of claim 5, wherein the control logic circuit is configured such that when a result of the pass/fail check is indicated as an erase pass, the control logic circuit determines whether the memory cells of the first memory block are at an abnormal state, using a result of the read performed using the second read voltage.

8. The nonvolatile memory device of claim 1, wherein a level of the extra erase voltage is the same as that of an erase voltage of a most recent previous erase loop.

9. The nonvolatile memory device of claim 1, wherein a level of the extra erase voltage is higher than or lower than that of an erase voltage of a most recent previous erase loop.

10. The nonvolatile memory device of claim 1, wherein the control logic circuit is configured to read the memory cells of the first memory block using the second read voltage when a first type of erase command is received and not to read the memory cells of the first memory block using the second read voltage when a second type of erase command is received.

11. The nonvolatile memory device of claim 1, wherein the control logic circuit is configured to read the memory cells of the first memory block using the second read voltage when a monitor read operation is enabled and not to read the memory cells of the first memory block using the second read voltage when the monitor read operation is disabled, and wherein the monitor read operation is controlled by an external device.

12. The nonvolatile memory device of claim 1, wherein the control logic circuit is configured such that when the memory cells of the first memory block are in an abnormal state, the control logic circuit stores abnormal information associated with the first memory block.

13. The nonvolatile memory device of claim 12, wherein the control logic circuit is configured such that during a following erase operation on the memory cells of the first memory block, the control logic circuit applies the extra erase voltage to the memory cells of the first memory block without a read operation using the second read voltage after the memory cells of the first memory block are indicated as an erase pass, based on the stored abnormal information.

14. The nonvolatile memory device of claim 12, wherein the control logic circuit is configured to store the abnormal information together with a count, wherein the control logic circuit is configured such that when a following erase operation is performed at selected memory cells of the first memory block, the control logic circuit decreases the count, and wherein the control logic circuit is configured such that when the count is 0, the control logic circuit deletes the abnormal information and the count.

15. The nonvolatile memory device of claim 1, wherein the control logic circuit is configured such that when the memory cells of the first memory block are determined as being at an abnormal state, the control logic circuit stores abnormal information associated with the first memory block.

16. A storage device, comprising:
a nonvolatile memory device comprising a plurality of memory blocks each comprising a plurality of memory cells; and
a controller configured to transfer an erase command for a selected memory block of the nonvolatile memory device to the nonvolatile memory device,
wherein the nonvolatile memory device is configured to perform an erase operation on memory cells of the selected memory block in response to the erase command,
wherein the erase operation comprises iteratively performing an erase loop which comprises an erase section in which an erase voltage is applied to the memory cells of the selected memory block and an erase verification section in which the memory cells of the selected memory block are verified using an erase verification voltage,
wherein the nonvolatile memory device is configured such that if the memory cells of the selected memory block are determined as an erase pass in the erase verification section, the nonvolatile memory device monitors the memory cells of the selected memory block,
wherein the nonvolatile memory device is configured such that if the monitored result indicates that the memory cells of the selected memory block are at an abnormal state, the nonvolatile memory device applies an extra erase voltage to the memory cells of the selected memory block, and
wherein the nonvolatile memory device is configured such that threshold voltages of the memory cells of the selected memory block when the extra erase voltage is applied to the memory cells of the selected memory block are lower than corresponding threshold voltages of the memory cells of the selected memory block when an erase voltage of a most recent previous erase loop is applied to the memory cells of the selected memory block.

17. The storage device of claim 16, wherein memory cells of each memory block are formed to have a three-dimensional structure, and wherein each memory cell comprises a charge trap layer.

18. A method for operating a nonvolatile memory device which comprises a plurality of memory blocks each comprising a plurality of memory cells, the method comprising:

a) iteratively performing an erase loop by applying an erase voltage to memory cells of a first memory block of the plurality of memory blocks;
b) after the erase loop is performed, performing a first read on the memory cells of the first memory block using a first read voltage;
c) counting a first number of on-cells or off-cells based on a result of the first read;

performing a second read on the memory cells of the first memory block using a second read voltage smaller than the first read voltage; and performing an extra erase by applying an extra erase voltage to the memory cells of the first memory block based on a result of the second read such that threshold voltages of the memory cells of the first memory block when the extra erase voltage is applied to the memory cells of the first memory block are lower than corresponding threshold voltages of the memory cells of the first memory block when an erase voltage of a most recent previous erase loop is applied to the memory cells of the first memory block.

19. The method of claim 18, further comprising:

counting a second number of on-cells or off-cells based on a result of the second read, wherein when the second number of on-cells is smaller than a first reference number or the second number of off-cells is greater than a second reference number the same as or different from the first reference number, performing the extra erase.

20. The method of claim 18, wherein when the first number of on-cells is greater than a first reference number or the first number of off-cells is smaller than a second reference number the same as or different from the first reference number, performing the second read.

* * * * *